(12) United States Patent
Azad et al.

(10) Patent No.: US 12,368,020 B2
(45) Date of Patent: *Jul. 22, 2025

(54) PULSED VOLTAGE SOURCE FOR PLASMA PROCESSING APPLICATIONS

(71) Applicant: Applied Materials, Inc., Santa Clara, CA (US)

(72) Inventors: A N M Wasekul Azad, Santa Clara, CA (US); Kartik Ramaswamy, San Jose, CA (US); Yang Yang, San Diego, CA (US); Yue Guo, Redwood City, CA (US); Fernando Silveira, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/612,757

(22) Filed: Mar. 21, 2024

(65) Prior Publication Data

US 2024/0234087 A1   Jul. 11, 2024

Related U.S. Application Data

(63) Continuation of application No. 17/835,864, filed on Jun. 8, 2022, now Pat. No. 11,972,924.

(51) Int. Cl.
  *H03K 5/02* (2006.01)
  *H01J 37/32* (2006.01)
  *H03K 17/687* (2006.01)

(52) U.S. Cl.
  CPC ...... *H01J 37/32091* (2013.01); *H03K 17/687* (2013.01); *H01J 2237/327* (2013.01)

(58) Field of Classification Search
  None
  See application file for complete search history.

(56) References Cited

U.S. PATENT DOCUMENTS 4,070,589 A   1/1978   Martinkovic
4,340,462 A   7/1982   Koch
(Continued)

FOREIGN PATENT DOCUMENTS

CN   101990353 A   3/2011
CN   102084024 A   6/2011
(Continued)

OTHER PUBLICATIONS

Japanese Office Action issued to patent application No. 2023-503504 on Feb. 27, 2024.
(Continued)

*Primary Examiner* — Kenneth B Wells

(57) ABSTRACT

Embodiments provided herein generally include apparatus, e.g., plasma processing systems, and methods for the plasma processing of a substrate in a processing chamber. Some embodiments are directed to a waveform generator. The waveform generator generally includes a first voltage stage having: a first voltage source; a first switch; a ground reference; a transformer having a first transformer ratio, the first transformer comprising: a primary winding coupled to the first voltage source and the ground reference; and a secondary winding having a first end and a second end, wherein the first end is coupled to the ground reference, and the second end is configured to be coupled to a load through a common node; and a first diode coupled in parallel with the primary winding of the first transformer. The waveform generator generally also includes one or more additional voltage stages coupled to a load through the common node.

20 Claims, 13 Drawing Sheets

(56) References Cited

U.S. PATENT DOCUMENTS

| | | |
|---|---|---|
| 4,464,223 A | 8/1984 | Gorin |
| 4,504,895 A | 3/1985 | Steigerwald |
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,242,561 A | 9/1993 | Sato |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,905,646 A | 5/1999 | Crewson et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert et al. |
| 7,509,105 B2 | 3/2009 | Ziegler |
| 7,512,387 B2 | 3/2009 | Glueck |
| 7,535,688 B2 | 5/2009 | Yokouchi et al. |
| 7,569,791 B2 | 8/2009 | Smith et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |

(56) References Cited

U.S. PATENT DOCUMENTS

| | | |
|---|---|---|
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,962,488 B2 | 2/2015 | Liao et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu et al. |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |

(56) References Cited

U.S. PATENT DOCUMENTS

| | | |
|---|---|---|
| 10,027,314 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapi 70nski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,516,388 B1 | 12/2019 | Kim et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,631,395 B2 | 4/2020 | Sanders et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 11,476,090 B1 | 10/2022 | Ramaswamy et al. |
| 11,569,066 B2 | 1/2023 | Cubaynes et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0112536 A1 | 6/2004 | Quon |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |

(56) References Cited

U.S. PATENT DOCUMENTS

| | | |
|---|---|---|
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0271317 A1 | 11/2006 | Ammerman et al. |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima et al. |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2009/0316438 A1 | 12/2009 | Crewson et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0117860 A1* | 5/2011 | Kimball .............. H03F 3/195 455/73 |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2012/0320637 A1* | 12/2012 | Kyono ............. H02M 3/33571 363/21.02 |
| 2013/0059448 A1 | 3/2013 | Marakhtanov et al. |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1 | 5/2014 | Finley et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |

(56) References Cited

U.S. PATENT DOCUMENTS

| | | |
|---|---|---|
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0032100 A1 | 2/2018 | Kim et al. |
| 2018/0041183 A1 | 2/2018 | Mavretic et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0323576 A1 | 11/2018 | Crawford et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2018/0374684 A1 | 12/2018 | Collins et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157041 A1 | 5/2019 | Zyl et al. |
| 2019/0157042 A1 | 5/2019 | Van Zyl et al. |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0259562 A1 | 8/2019 | Dorf et al. |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318915 A1 | 10/2019 | Nagami et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0041288 A1 | 2/2020 | Wang |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0111644 A1 | 4/2020 | Long et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0227230 A1 | 7/2020 | Ziemba et al. |
| 2020/0227289 A1 | 7/2020 | Song et al. |
| 2020/0234922 A1 | 7/2020 | Dorf et al. |
| 2020/0234923 A1 | 7/2020 | Dorf et al. |
| 2020/0243303 A1 | 7/2020 | Mishra et al. |
| 2020/0251371 A1 | 8/2020 | Kuno et al. |
| 2020/0253034 A1 | 8/2020 | Long et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0272775 A1 | 9/2021 | Koshimizu |
| 2021/0288582 A1 | 9/2021 | Ziemba et al. |
| 2021/0407769 A1 | 12/2021 | Kim et al. |
| 2023/0029754 A1 | 2/2023 | Cubaynes et al. |
| 2023/0067046 A1 | 3/2023 | Ramaswamy et al. |

FOREIGN PATENT DOCUMENTS

| | | |
|---|---|---|
| CN | 101707186 B | 2/2012 |
| CN | 105408993 A | 3/2016 |
| CN | 106206234 A | 12/2016 |
| CN | 104752134 B | 2/2017 |
| CN | 109474259 A | 3/2019 |
| EP | 665306 A1 | 8/1995 |
| EP | 983394 A1 | 3/2000 |
| EP | 1119033 A1 | 7/2001 |
| EP | 1203441 A1 | 5/2002 |
| EP | 1214459 A1 | 6/2002 |
| EP | 1418670 A1 | 5/2004 |
| EP | 1691481 A1 | 8/2006 |
| EP | 1701376 A1 | 9/2006 |
| EP | 1708239 A1 | 10/2006 |
| EP | 1780777 A1 | 5/2007 |
| EP | 1852959 A1 | 11/2007 |
| EP | 2016610 A1 | 1/2009 |
| EP | 2096679 A1 | 9/2009 |
| EP | 2221614 A1 | 8/2010 |
| EP | 2541584 A1 | 1/2013 |
| EP | 2580368 A1 | 4/2013 |
| EP | 2612544 A1 | 7/2013 |
| EP | 2838112 A1 | 2/2015 |
| EP | 2991103 A1 | 3/2016 |
| EP | 3086359 A1 | 10/2016 |
| EP | 3396700 A1 | 10/2018 |
| EP | 3616234 A1 | 3/2020 |
| JP | H08236602 A | 9/1996 |
| JP | 2748213 B2 | 5/1998 |
| JP | H11025894 A | 1/1999 |

(56) References Cited

FOREIGN PATENT DOCUMENTS

| | | |
|---|---|---|
| JP | 2002299322 A | 10/2002 |
| JP | 2002313899 A | 10/2002 |
| JP | 4418424 B2 | 2/2010 |
| JP | 2011035266 A | 2/2011 |
| JP | 5018244 B2 | 9/2012 |
| JP | 2013122966 A | 6/2013 |
| JP | 2014112644 A | 6/2014 |
| JP | 2016225439 A | 12/2016 |
| JP | 6396822 B2 | 9/2018 |
| JP | 2015534716 A | 3/2019 |
| JP | 2019192876 A | 10/2019 |
| JP | 6741461 B2 | 8/2020 |
| JP | 2021175250 A | 11/2021 |
| KP | 1020180012060 A | 2/2018 |
| KR | 100757347 B1 | 9/2007 |
| KR | 10-2007-0098556 A | 10/2007 |
| KR | 20160042429 A | 4/2016 |
| KR | 20190125195 A | 11/2019 |
| KR | 20200036947 A | 4/2020 |
| TJ | 201523684 A | 6/2015 |
| TW | 498706 B | 8/2002 |
| TW | 201717247 A | 5/2017 |
| TW | 201916163 A | 4/2019 |
| TW | 202044321 A | 12/2020 |
| TW | 202112186 A | 3/2021 |
| WO | 1998053116 A1 | 11/1998 |
| WO | 2000017920 A1 | 3/2000 |
| WO | 2000030147 A1 | 5/2000 |
| WO | 2000063459 A1 | 10/2000 |
| WO | 2001005020 A1 | 1/2001 |
| WO | 2001012873 A1 | 2/2001 |
| WO | 2001013402 A1 | 2/2001 |
| WO | 2002052628 A1 | 7/2002 |
| WO | 2002054835 A2 | 7/2002 |
| WO | 2002059954 A1 | 8/2002 |
| WO | 2003037497 A2 | 5/2003 |
| WO | 2003052882 A2 | 6/2003 |
| WO | 2003054911 A2 | 7/2003 |
| WO | 2003077414 A2 | 9/2003 |
| WO | 2004084394 A1 | 9/2004 |
| WO | 2005124844 A1 | 12/2005 |
| WO | 2007118042 A2 | 10/2007 |
| WO | 2008016747 A2 | 2/2008 |
| WO | 2008050619 A1 | 5/2008 |
| WO | 2008061775 A1 | 5/2008 |
| WO | 2008061784 A1 | 5/2008 |
| WO | 2008062663 A1 | 5/2008 |
| WO | 2009012804 A1 | 1/2009 |
| WO | 2009069670 A1 | 6/2009 |
| WO | 2009111473 A2 | 9/2009 |
| WO | 2011073093 A1 | 6/2011 |
| WO | 2011087984 A2 | 7/2011 |
| WO | 2011156055 A1 | 12/2011 |
| WO | 2012030500 A1 | 3/2012 |
| WO | 2012109159 A1 | 8/2012 |
| WO | 2012122064 A1 | 9/2012 |
| WO | 2013000918 A1 | 1/2013 |
| WO | 2013016619 A1 | 1/2013 |
| WO | 2013084459 A1 | 6/2013 |
| WO | 2013088677 A1 | 6/2013 |
| WO | 2013099133 A1 | 7/2013 |
| WO | 2013114882 A1 | 8/2013 |
| WO | 2013118660 A1 | 8/2013 |
| WO | 2013125523 A1 | 8/2013 |
| WO | 2013187218 A1 | 12/2013 |
| WO | 2014035889 A1 | 3/2014 |
| WO | 2014035894 A1 | 3/2014 |
| WO | 2014035897 A1 | 3/2014 |
| WO | 2014036000 A1 | 3/2014 |
| WO | 2014124857 A2 | 8/2014 |
| WO | 2014197145 A1 | 12/2014 |
| WO | 2017208807 A1 | 12/2014 |
| WO | 2015060185 A1 | 4/2015 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2016060058 A1 | 4/2016 |
| WO | 2016060063 A1 | 4/2016 |
| WO | 2015073921 A8 | 5/2016 |
| WO | 2016104098 A1 | 6/2016 |
| WO | 2016128384 A1 | 8/2016 |
| WO | 2016131061 A1 | 8/2016 |
| WO | 2016170989 A1 | 10/2016 |
| WO | 2017172536 A1 | 10/2017 |
| WO | 2018048925 A1 | 3/2018 |
| WO | 2018111751 A1 | 6/2018 |
| WO | 2018170010 A1 | 9/2018 |
| WO | 2018197702 A1 | 11/2018 |
| WO | 2019036587 A1 | 2/2019 |
| WO | 2019040949 A1 | 2/2019 |
| WO | 2019099870 A1 | 5/2019 |
| WO | 2019185423 A1 | 10/2019 |
| WO | 2019225184 A1 | 11/2019 |
| WO | 2019239872 A1 | 12/2019 |
| WO | 2019244697 A1 | 12/2019 |
| WO | 2019244698 A1 | 12/2019 |
| WO | 2019244734 A1 | 12/2019 |
| WO | 2019245729 A1 | 12/2019 |
| WO | 2020004048 A1 | 1/2020 |
| WO | 2020017328 A1 | 1/2020 |
| WO | 2020022318 A1 | 1/2020 |
| WO | 2020022319 A1 | 1/2020 |
| WO | 2020026802 A1 | 2/2020 |
| WO | 2020036806 A1 | 2/2020 |
| WO | 2020037331 A1 | 2/2020 |
| WO | 2020046561 A1 | 3/2020 |
| WO | 2020051064 A1 | 3/2020 |
| WO | 2020095550 A1 | 5/2020 |
| WO | 2020112921 A1 | 6/2020 |
| WO | 2020121819 A1 | 6/2020 |
| WO | 2020145051 A1 | 7/2020 |
| WO | 2021003319 A1 | 1/2021 |
| WO | 2016059207 A1 | 4/2021 |
| WO | 2021062223 A1 | 4/2021 |
| WO | 2021097459 A1 | 5/2021 |
| WO | 2021134000 A1 | 7/2021 |
| WO | 2021255875 A1 | 12/2021 |
| WO | 2023161503 A1 | 8/2023 |
| WO | 2019099102 A1 | 5/2024 |

OTHER PUBLICATIONS

J. Holma et al. "Measurements on a 20-Layer 12.5 kV Prototype Inductive Adder for the Clic Dr. Kickers", Applied Materials Inc.. Downloaded on May 26, 2022. 5 pages.

D. Bortis et al. "Optimal Design of a DC Reset Circut for Pulse Transformers", Power Electronic Systems Laboratory (PES), 2007 IEEE.

Landon Collier, "Performance Analysis of an All Solid-State Linear Transformer Driver", IEEE Transactions on Plasma Science, vol. 45, No. 7, Jul. 2017.

"Solid State Linear Transformer Driver (LTD) Development for HPM Sources" Applied Materials Inc. Downloaded on Dec. 1, 2021. 4 pages.

Junfeng Rao et al. "Study on the Basic Characteristics of Solid-State Linear Transformer Drivers", IEEE Transactions on Plasma Science, vol. 48, No. 9, Sep. 2020.

Janne Holma et al. "The Prototype Inductive Adder With Droop Compensation for the CLIC Kicker Systems", IEEE Transactions on Plasma Science, vol. 42, No. 10, Oct. 2014.

"A Solid-State, Inductive-Adder, 10-KV Pulse Generator for Driving Large-Aperture Pockels Cells", LLE Review, vol. 133. 2017.

Haozheng Shi et al. "Design of Inductive Pulsed Current Generator Based on Solid-State Marx Adder", 2016 IEEE.

Li-Min Wang et al. "Development of Five Stage Solid-State Linear Transformer Driver", Cite as: Rev. Sci. Instrum. 91, 094706 (2020); <https://doi.org/10.1063/5.0018088>, Submitted: Jun. 15, 2020 • Accepted: Sep. 6, 2020 • Published Online: Sep. 21, 2020.

Wang, S.B., et al.—"Control of ion energy distribution at substrates during plasma processing," Journal of Applied Physics, vol. 88, No. 2, Jul. 15, 2000, pp. 643-646.

(56) References Cited

OTHER PUBLICATIONS

PCT International Search Report and Written Opinion dated Nov. 9, 2018, for International Application No. PCT/US2018/043032.
Taiwan Office Action for Application No. 107125613 dated Dec. 24, 2020, 16 pages.
PCT International Search Report and Written Opinion dated Nov. 7, 2018, for International Application No. PCT/US2018/042965.
Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.
Eagle Harbor Technologies webpage—"EHT Integrator Demonstration at DIII-D," 2015, 1 page.
Eagle Harbor Technologies webpage—"High Gain and Frequency Ultra-Stable Integrators for ICC and Long Pulse ITER Applications," 2012, 1 page.
Eagle Harbor Technologies webpage—High Gain and Frequency Ultra-Stable Integrators for Long Pulse and/or High Current Applications, 2018, 1 page.
Eagle Harbor Technologies webpage—"In Situ Testing of EHT Integrators on a Tokamak," 2015, 1 page.
Eagle Harbor Technologies webpage—"Long-Pulse Integrator Testing with DIII-D Magnetic Diagnostics," 2016, 1 page.
Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.
Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp_ 1-6, 2014.
Semiconductor Components Industries, LLC (SCILLC)—"Switch-Mode Power Supply" Reference Manual, SMPSRM/D, Rev. 4, Apr. 2014, ON Semiconductor, 73 pages.
Sunstone Circuits—"Eagle Harbor Tech Case Study," date unknown, 4 pages.
International Search Report and Written Opinion for PCT/US2019/052067 dated Jan. 21, 2020.
Electrical 4 U webpage—"Clamping Circuit," Aug. 29, 2018, 9 pages.
Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.
PCT Notification of Transmittal of the International Search Report and the Written Opinion of the International Searching Authority for International Application No. PCT/US2019/048392; dated Dec. 16, 2019; 13 pages.
PCT International Search Report and Written Opinion dated Nov. 7, 2018, for International Application No. PCT/US2018/042961.
PCT International Search Report and Written Opinion dated Nov. 7, 2018, for International Application No. PCT/US2018/042956.
U.S. Appl. No. 62/433,204; entitled Creating Arbitrarily-Shaped Ion Energy Distribution Function (IEDF) Using Shaped-Pulse (EV) Bias; by Leonid Dorf, et al.; filed Dec. 16, 2016; 22 total pages.
U.S. Appl. No. 15/424,405; entitled System for Tunable Workpiece Biasing in a Plasma Reactor; by Travis Koh, et al.; filed Feb. 3, 2017; 29 total pages.
U.S. Appl. No. 15/618,082; entitled Systems and Methods for Controlling a Voltage Waveform at a Substrate During Plasma Processing; by Leonid Dorf, et al.; filed Jun. 8, 2017; 35 total pages.
PCT Notification of Transmittal of the International Search Report and the Written Opinion of the International Searching Authority for International Application No. PCT/US2018/046171; dated Nov. 28, 2018; 10 total pages.
PCT Notification of Transmittal of the International Search Report and the Written Opinion of the International Searching Authority for International Application No. PCT/US2018/046182; dated Nov. 30, 2018; 10 total pages.
Eagle Harbor Technologies presentation by Dr. Kenneth E. Miller—"The EHT Long Pulse Integrator Program," ITPA Diagnostic Meeting, General Atomics, Jun. 4-7, 2013, 18 pages.
Lin, Jianliang, et al.,—"Diamond like carbon films deposited by HiPIMS using oscillatory voltage pulses," Surface & Coatings Technology 258, 2014, published by Elsevier B.V., pp. 1212-1222.
PCT/US2020/014453 Interanational Search Report and Written Opinion dated May 14, 2020 consists of 8 pages.
S.B. Wang et al. "Ion Bombardment Energy and SiO 2/Si Fluorocarbon Plasma Etch Selectivity", Journal of Vacuum Science & Technology A 19, 2425 (2001).
Korean Office Action for 10-2020-7007495 dated Jun. 14, 2021.
Zhen-hua Bi et al., A brief review of dual-frequency capacitively coupled discharges, Current Applied Physics, vol. 11, Issue 5, Supplement, 2011, pp. S2-S8.
Chang, Bingdong, " Oblique angled plasma etching for 3D silicon structures with wiggling geometries" 31(8), [085301]. https://doi.org/10.1088/1361-6528/ab53fb. DTU Library. 2019.
Michael A. Lieberman, "A short course of the principles of plasma discharges and materials processing", Department of Electrical Engineering and Computer Sciences University of California, Berkeley, CA 94720.
Dr. Steve Sirard, "Introduction to Plasma Etching", Lam Research Corporation. 64 pages.
Zhuoxing Luo, B_S_, M.S, "RF Plasma Etching With a DC Bias" A Dissertation in Physics_ Dec. 1994.
Michael A. Lieberman, "Principles of Plasma Discharges and Material Processing", A Wiley Interscience Publication. 1994.
Yiting Zhang et al. "Investigation of feature orientation and consequences of ion tilting during plasma etching with a three-dimensional feature profile simulator", Nov. 22, 2016.
Richard Barnett et al. A New Plasma Source for Next Generation MEMS Deep Si Etching: Minimal Tilt, Improved Profile Uniformity and Higher Etch Rates, SPP Process Technology Systems. 2010.
The International Search Report and the Written Opinion for International Application No. PCT/US2021/040380; dated Oct. 27, 2021; 10 pages.
International Search Report and Written Opinion dated Feb. 4, 2022 for Application No. PCT/US2021/054806.
International Search Report and Written Opinion dated Feb. 4, 2022 for Application No. PCT/US2021/054814.
U.S. Appl. No. 17/346,103, filed Jun. 11, 2021.
U.S. Appl. No. 17/349,763, filed Jun. 16, 2021.
U.S. Appl. No. 63/242,410, filed Sep. 9, 2021.
U.S. Appl. No. 17/410,803, filed Aug. 24, 2021.
U.S. Appl. No. 17/537,107, filed Nov. 29, 2021.
U.S. Appl. No. 17/352,165, filed Jun. 18, 2021.
U.S. Appl. No. 17/352,176, filed Jun. 18, 2021.
U.S. Appl. No. 17/337,146, filed Jun. 2, 2021.
U.S. Appl. No. 17/361,178, filed Jun. 28, 2021.
U.S. Appl. No. 63/210,956, filed Jun. 15, 2021.
U.S. Appl. No. 17/475,223, filed Sep. 14, 2021.
U.S. Appl. No. 17/537,314, filed Nov. 29, 2021.
Chinese Office Action for 201880053380.1 dated Dec. 2, 2021.
Taiwan Office Action for 108132682 dated Mar. 24, 2022.
International Search Report/ Written Opinion issued to PCT/US2022/030723 on Sep. 13, 2022.
International Search Report / Written Opinion Issued To PCT/US2022/040270 on Dec. 1, 2022.
International Search Report dated May 10, 2023 for Application No. PCT/US2023/010024.
Taiwan Office Action issued to Patent Application No. 111130885 on Aug. 16, 2023.
Taiwan Office Action issued to Patent Application No. 111130885 on Oct. 30, 2023.
Japanese Office Action for Application No. 2023-504709 dated Dec. 19, 2023.

(56) References Cited

OTHER PUBLICATIONS

Office Action from Taiwanese Patent Application No. 111120198 dated Jan. 11, 2024.
IEEE Standard American National Standard Canadian Standard, "Graphic Symbols for Electrical and Electronics Diagrams", IEEE Standards Coordination Committee 11, Graphic Symbols, Secretariat for American National Standards Committee Y32, IEEE Std 315-1975 (Reaffirmed 1993).
Taiwan Office Action issued to patent application No. 113118555 on Jun. 18, 2024.
Korean Office Action issued to patent application No. 10-2023-7002925 on Nov. 26, 2024.
Taiwan Office Action issued to patent application No. 112100301 on May 2, 2025.

* cited by examiner

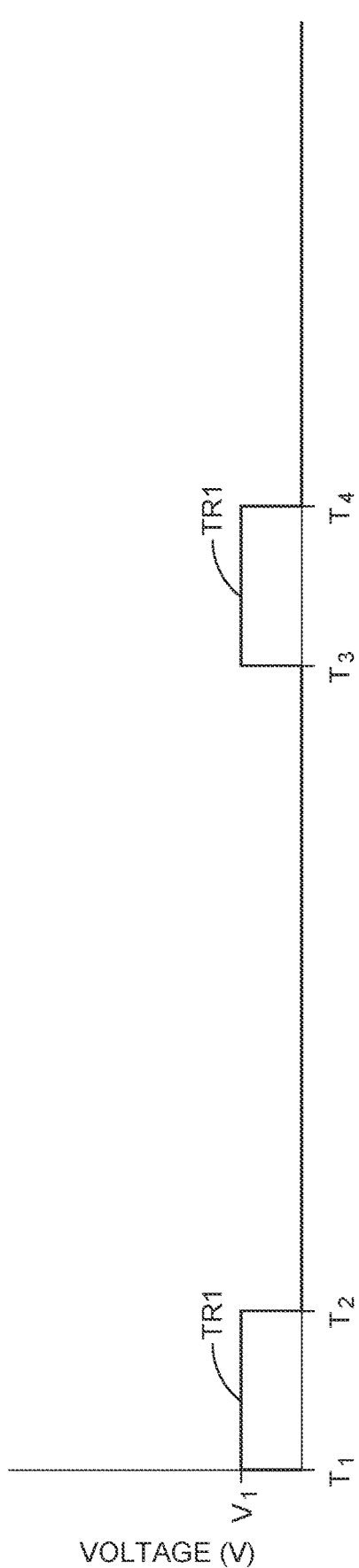
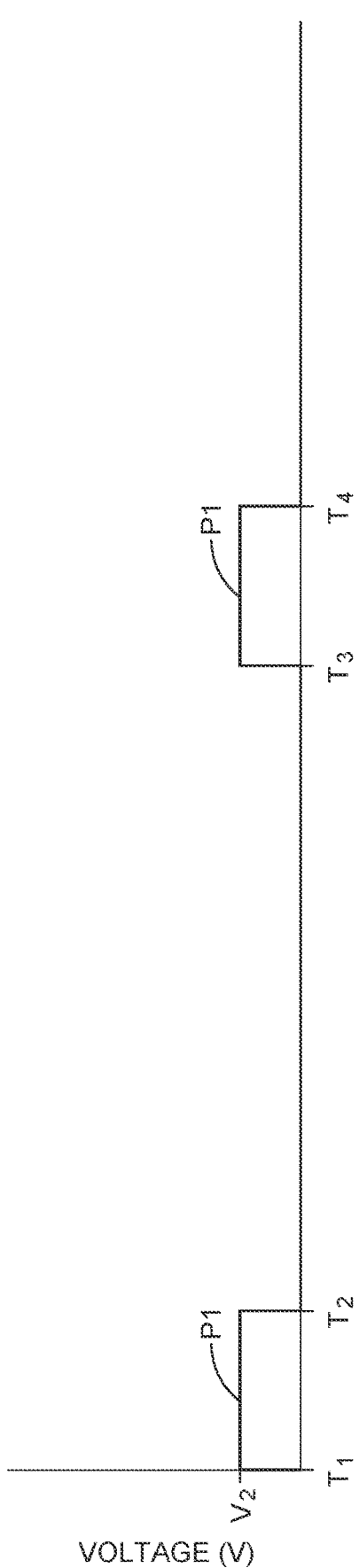
Fig. 7A
Fig. 7B

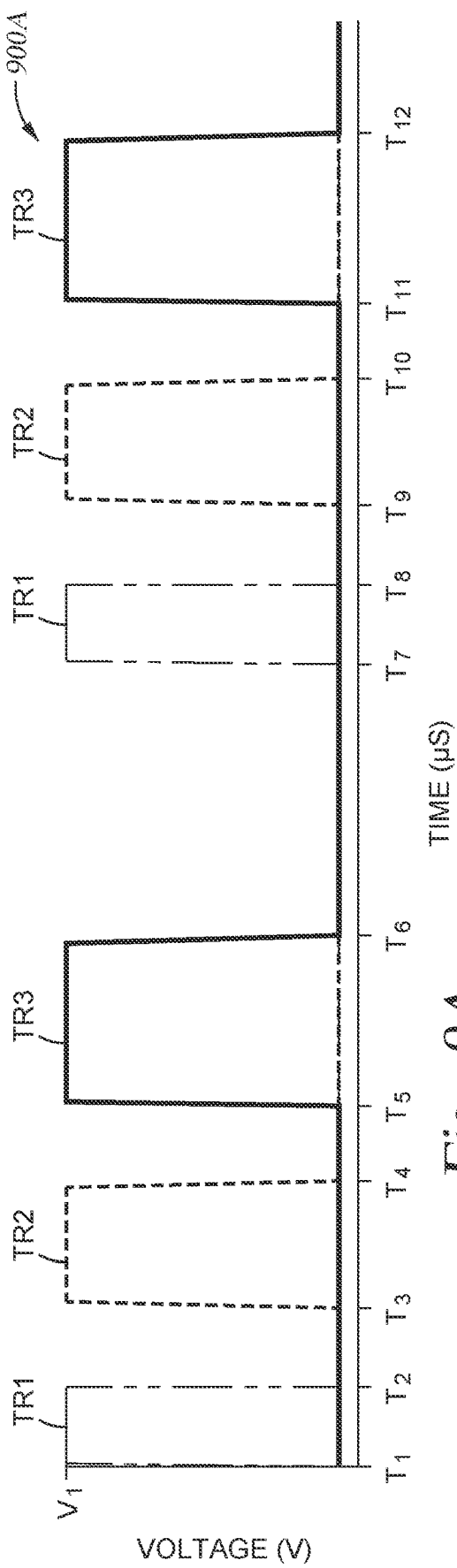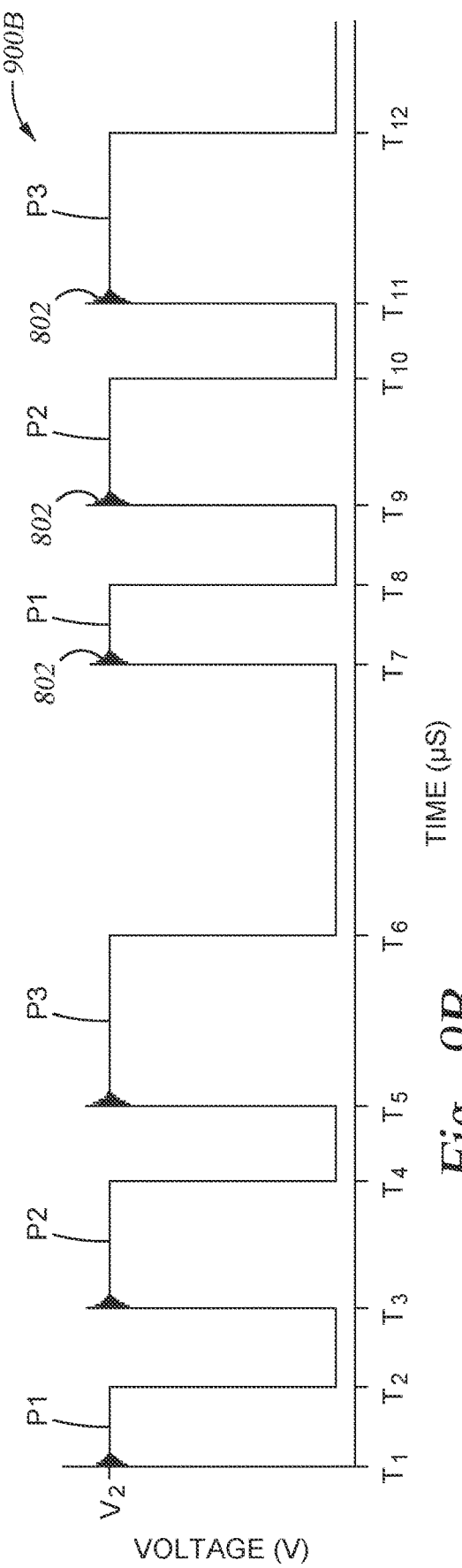

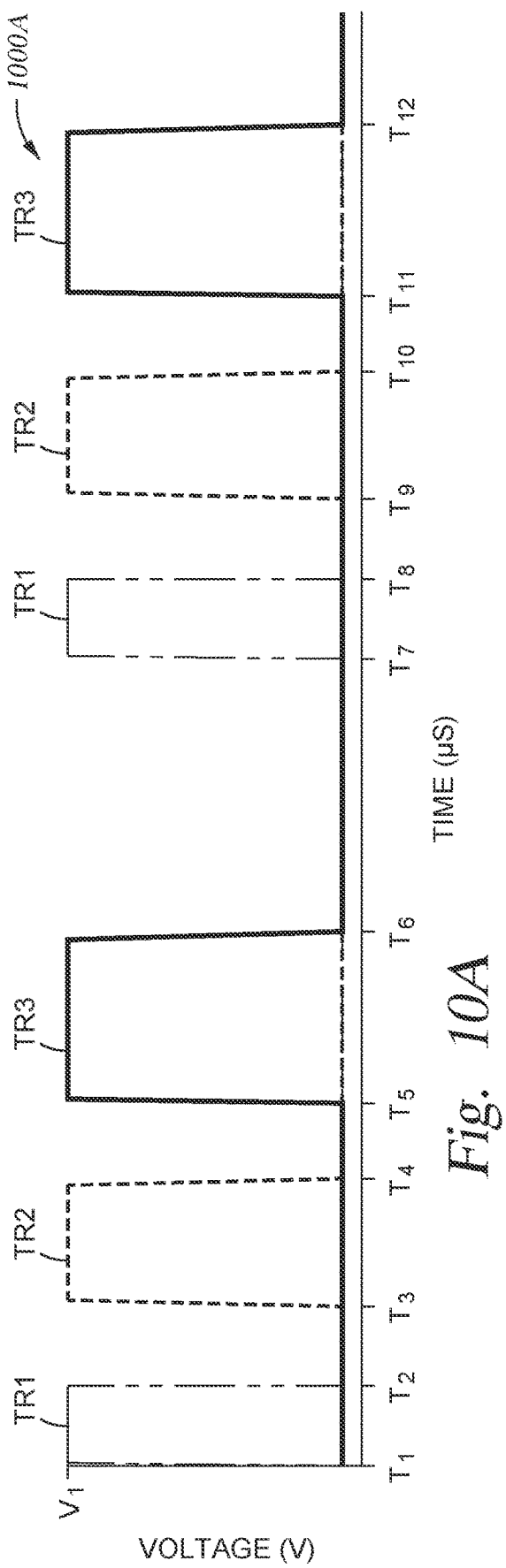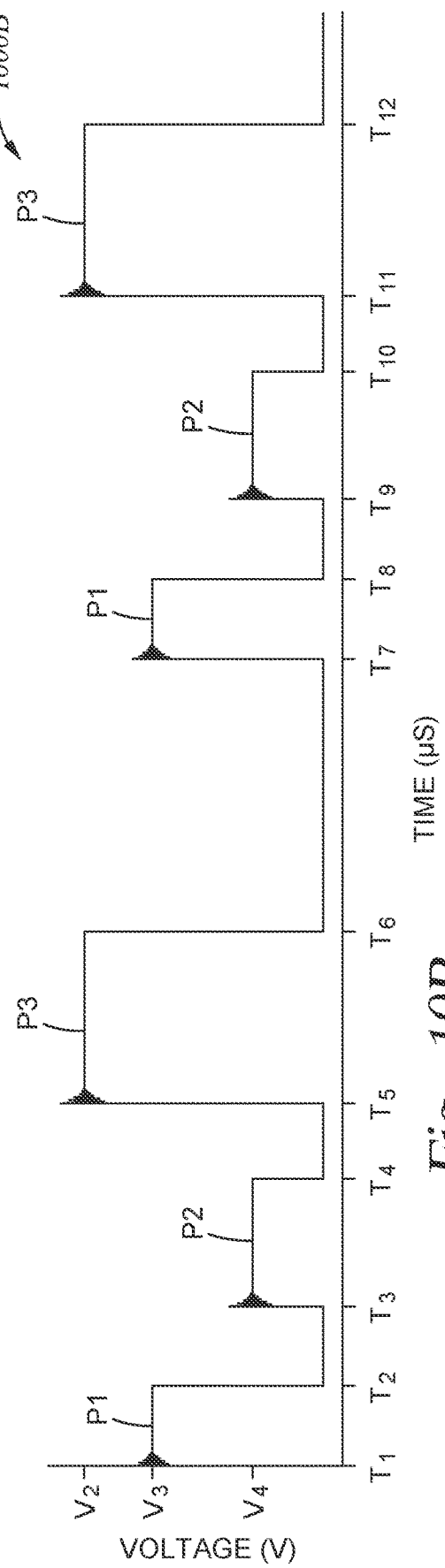
Fig. 10A
Fig. 10B

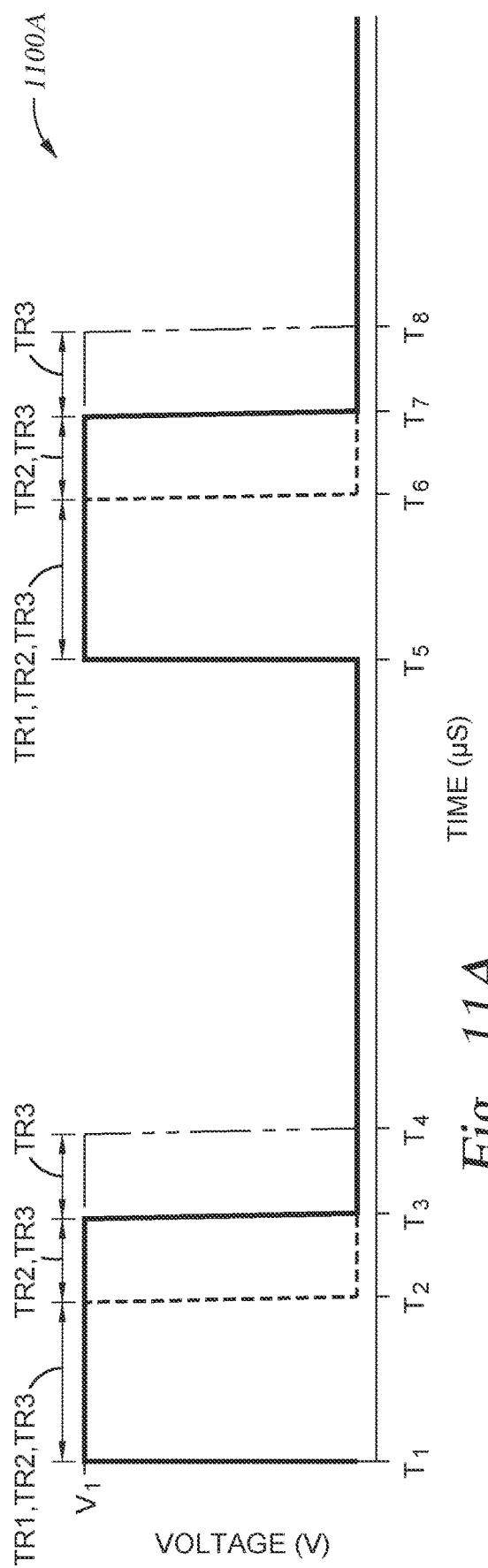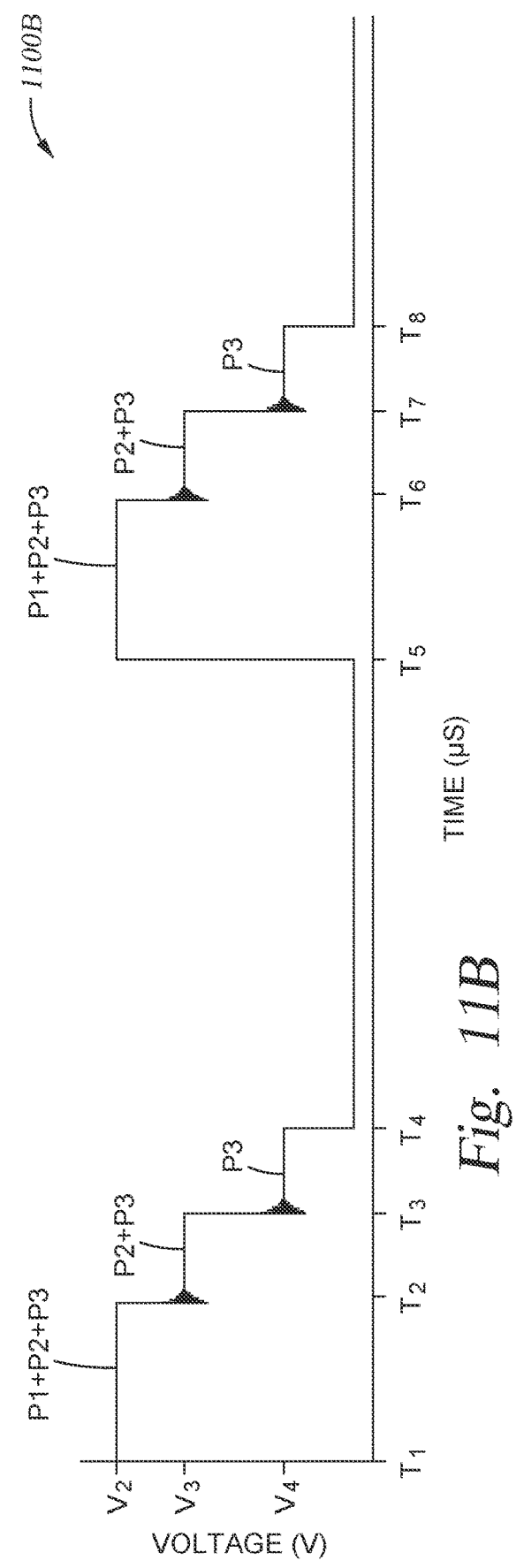

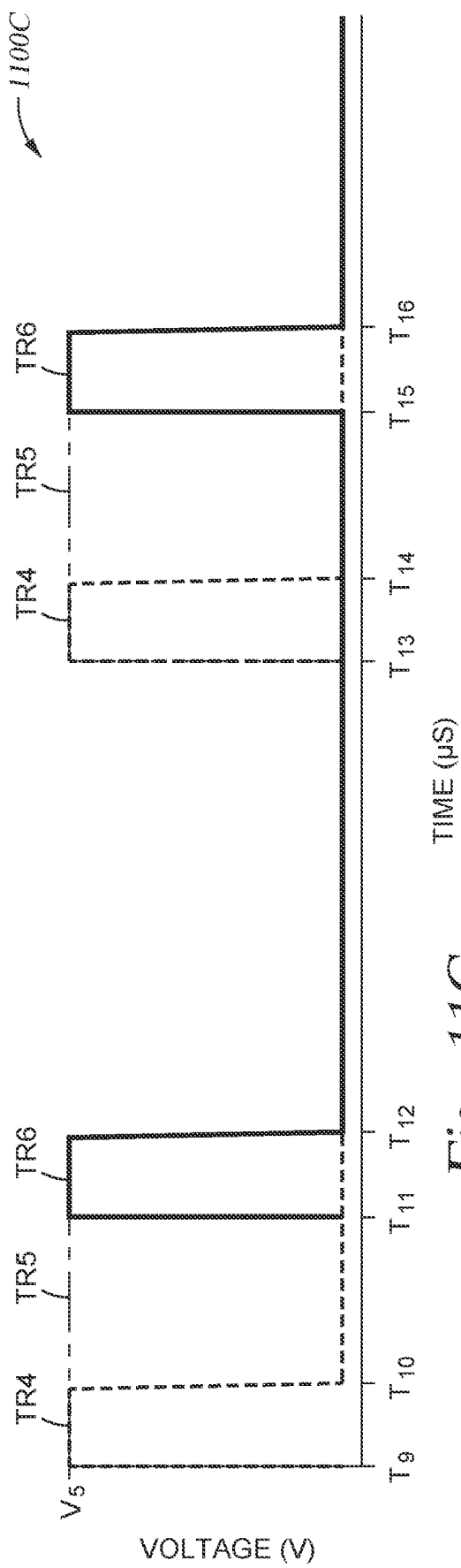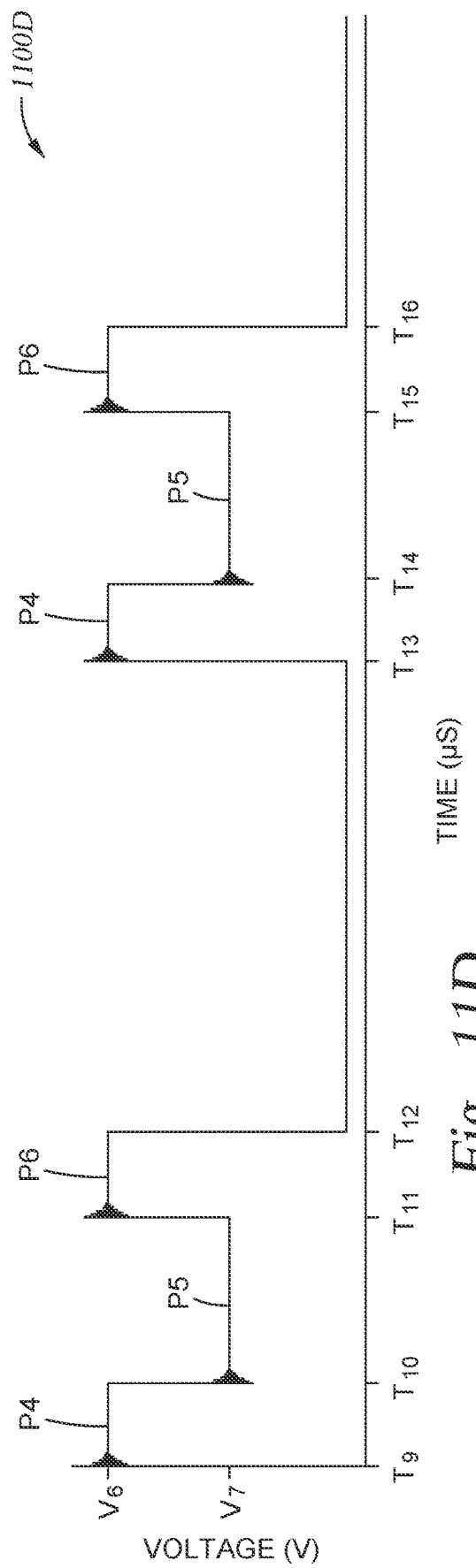

PULSED VOLTAGE SOURCE FOR PLASMA PROCESSING APPLICATIONS

CROSS REFERENCE TO RELATED APPLICATIONS

The present application is a continuation of U.S. Pat. No. 11,972,924, which is expressly incorporated by reference herein in its entirety as if fully set forth below and for all applicable purposes.

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma-assisted etching process to bombard a material formed on a surface of a substrate through openings formed in a patterned mask layer formed on the substrate surface.

With technology node advancing towards 2 nm, the fabrication of smaller features with larger aspect ratios requires atomic precision for plasma processing. For etching processes where the plasma ions play a major role, ion energy control is always challenging the semiconductor equipment industry. In a typical plasma-assisted etching process, the substrate is positioned on an electrostatic chuck (ESC) disposed in a processing chamber, a plasma is formed over the substrate, and ions are accelerated from the plasma towards the substrate across a plasma sheath, i.e., region depleted of electrons, formed between the plasma and the surface of the substrate. Traditionally radio frequency (RF) substrate biasing methods, which use sinusoidal RF waveforms to excite the plasma and form the plasma sheath, have been unable to desirably form these smaller device feature sizes. Recently, it has been found that utilizing pulsed plasma sources to deliver high voltage direct current (DC) pulses to one or more electrodes within a processing chamber can be useful in desirably controlling the plasma sheath formed over the surface of the substrate.

Traditionally, pulsed power sources provide pulsed DC bias to a cathode, a metal plate known that can be coupled to the plasma using capacitive coupling through a dielectric layer. Switching frequency, and power dissipation capability are some of the major design considerations while designing such pulsed power sources. To facilitate high switching speed, MOSFETs are predominantly used in the pulsed power sources. However, the significant progress in the field of SiC and GaN MOSFETs notwithstanding, the maximum operating switching frequency of these MOSFETs is limited to tens of kHz to a few hundred kHz. As the device dimensions shrink under 10 nm in the semiconductor industry, pulsed DC bias sources with a switching frequency in the upper half of the hundreds of kHz range could be a tremendous tool to further control critical high aspect ratio features like etch selectivity and uniformity.

Accordingly, there is a need in the art for pulsed voltage source and biasing methods that are able to enable the completion of a desirable plasma-assisted process on a substrate.

SUMMARY

Embodiments provided herein generally include apparatus, e.g., plasma processing systems, and methods for the plasma processing of a substrate in a processing chamber.

Some embodiments are directed to a waveform generator. The waveform generator generally includes a first voltage stage having: a first voltage source; a first switch, wherein a first terminal of the first voltage source is coupled to a first terminal of the first switch; a ground reference, wherein a second terminal of the first switch is coupled to the ground reference; a transformer having a first transformer ratio, the first transformer comprising: a primary winding coupled to a second terminal of the first voltage source and the ground reference; and a secondary winding having a first end and a second end, wherein the first end is coupled to the ground reference; and a first diode coupled in parallel with the primary winding of the first transformer. The waveform generator generally also includes a second voltage stage having: a second voltage source; a second switch, wherein a first terminal of the second voltage source is coupled to a first terminal of the second switch; a second ground reference, wherein a second terminal of the second switch is coupled to the second ground reference; a second transformer having a second transformer ratio, the second transformer comprising: a primary winding coupled to a second terminal of the second voltage source and the second ground reference; and a secondary winding having a first end and a second end, wherein the first end is coupled to the second end of the secondary winding of the first transformer and the second end is configured to be coupled to a load through a common node; and a second diode coupled in parallel with the primary winding of the second transformer.

Some embodiments are directed to a method for waveform generation. The method generally includes generating a first voltage pulse at a common node by closing a first switch that has a first terminal and a second terminal, wherein: the first terminal of the first switch is coupled to a first terminal of a first voltage source; a second terminal of the first voltage source is coupled to a first terminal of a primary winding of a first transformer, the first transformer having a first transformer ratio; the second terminal of the first switch is coupled to a second terminal of the primary winding of the first transformer and to ground; and the common node is coupled to a first terminal of a secondary winding of the first transformer. The method for waveform generation also generally includes generating a second voltage pulse at the common node by closing a second switch that has a first terminal and a second terminal, wherein: the first terminal of the second switch is coupled to a first terminal of a second voltage source; a second terminal of the second voltage source is coupled to a first terminal of a primary winding of a second transformer, the second transformer having a second transformer ratio; the second terminal of the first switch is coupled to a second terminal of the primary winding of the second transformer and to ground; a second bias voltage is generated by the second voltage source between the first terminal and the second terminal of the second voltage source; and a first terminal of a secondary winding of the second transformer is coupled to a second terminal of the secondary winding of the first transformer, wherein the common node is disposed between the first terminal of the secondary winding of the first transformer and a load.

Some embodiments are directed to non-transitory computer-readable medium for generating a waveform which includes instructions executable by one or more processors. The instructions generally include generate a first voltage pulse at a common node by closing a first switch that has a first terminal and a second terminal, wherein: the first terminal of the first switch is coupled to a first terminal of a first voltage source; a second terminal of the first voltage source is coupled to a first terminal of a primary winding of a first transformer, the first transformer having a first transformer ratio; the second terminal of the first switch is coupled to a second terminal of the primary winding of the first transformer and to ground; and the common node is coupled to a first terminal of a secondary winding of the first transformer. The instructions generally also include generate a second voltage pulse at the common node by closing a second switch that has a first terminal and a second terminal, wherein: the first terminal of the second switch is coupled to a first terminal of a second voltage source; a second terminal of the second voltage source is coupled to a first terminal of a primary winding of a second transformer, the second transformer having a second transformer ratio; the second terminal of the first switch is coupled to a second terminal of the primary winding of the second transformer and to ground; a second bias voltage is generated by the second voltage source between the first terminal and the second terminal of the second voltage source; and a first terminal of a secondary winding of the second transformer is coupled to a second terminal of the secondary winding of the first transformer, wherein the common node is disposed between the first terminal of the secondary winding of the first transformer and a load.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

FIG. 7A is a graph showing states of switches of the pulser during various modes of operation, in accordance with certain embodiments of the present disclosure.

FIG. 7B is a graph showing an output provided by the pulser during the mode of operation illustrated in FIG. 7A, in accordance with certain embodiments of the present disclosure.

FIG. 9A is a graph showing states of switches of the pulser during various modes of operation, in accordance with certain embodiments of the present disclosure.

FIG. 9B is a graph showing an output provided by the pulser during the mode of operation illustrated in FIG. 9A, in accordance with certain embodiments of the present disclosure.

FIG. 10A is a graph showing states of switches of the pulser during various modes of operation, in accordance with certain embodiments of the present disclosure.

FIG. 10B is a graph showing an output provided by the pulser during the mode of operation illustrated in FIG. 10A, in accordance with certain embodiments of the present disclosure.

FIG. 11A is a graph showing states of switches of the pulser during various modes of operation, in accordance with certain embodiments of the present disclosure.

FIG. 11B is a graph showing an output provided by the pulser during the mode of operation illustrated in FIG. 11A, in accordance with certain embodiments of the present disclosure.

FIG. 11C is a graph showing states of switches of the pulser during various modes of operation, in accordance with certain embodiments of the present disclosure.

FIG. 11D is a graph showing an output provided by the pulser during the mode of operation illustrated in FIG. 11C, in accordance with certain embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Certain aspects of the present disclosure are generally directed to techniques for generating a voltage waveform for a plasma processing system. Traditionally, pulsed power sources provide pulsed direct current (DC) bias to a cathode, a metal plate, that is coupled to the plasma through a dielectric layer. Switching frequency, and power dissipation capability are some of the major design considerations while designing such pulsed power sources. To facilitate high switching speed, MOSFETs are predominantly used in the pulsed power sources. However, the significant progress in the field of SiC and GaN MOSFETs notwithstanding, the maximum operating switching frequency of these MOSFETs is limited to tens of kHz to a few hundred kHz. As the device dimensions shrink under 10 nm in the semiconductor industry, pulsed DC bias sources with a switching frequency in the upper half of the hundreds of kHz range could be a tremendous tool to further control critical high aspect ratio features like etch selectivity and uniformity.

In aspects of the present disclosure, a pulsed power sources (e.g., waveform generator) may include a number of stacked modules that allow for greater flexibility in different characteristics of a generated waveform. In some embodiments, a waveform generator can be adjusted to produce configurable output voltage waveforms for various applications and their respective requirements, which could include varying characteristics such as current, voltage, switching frequency (e.g., pulse frequency), pulse width, peak amplitude, pulse shape, and other requirements. In this manner, the waveform generator may be able to better control critical high aspect features, including etch selectivity and uniformity. In some embodiments, the waveform generator may mask the limitations of certain components, like for example, the maximum operating switching frequency or maximum voltage of a transistor typically available in semiconductor switches typically used in waveform generation, in order to better control critical high aspect features, including increased etch selectivity, uniformity, and throughout in the processing system 100. Thus, the waveform generator may enable the generation of a voltage waveform with a desired energy distribution function (IEDF) at the surface of the substrate.

Plasma Processing System Examples

Figure 1:
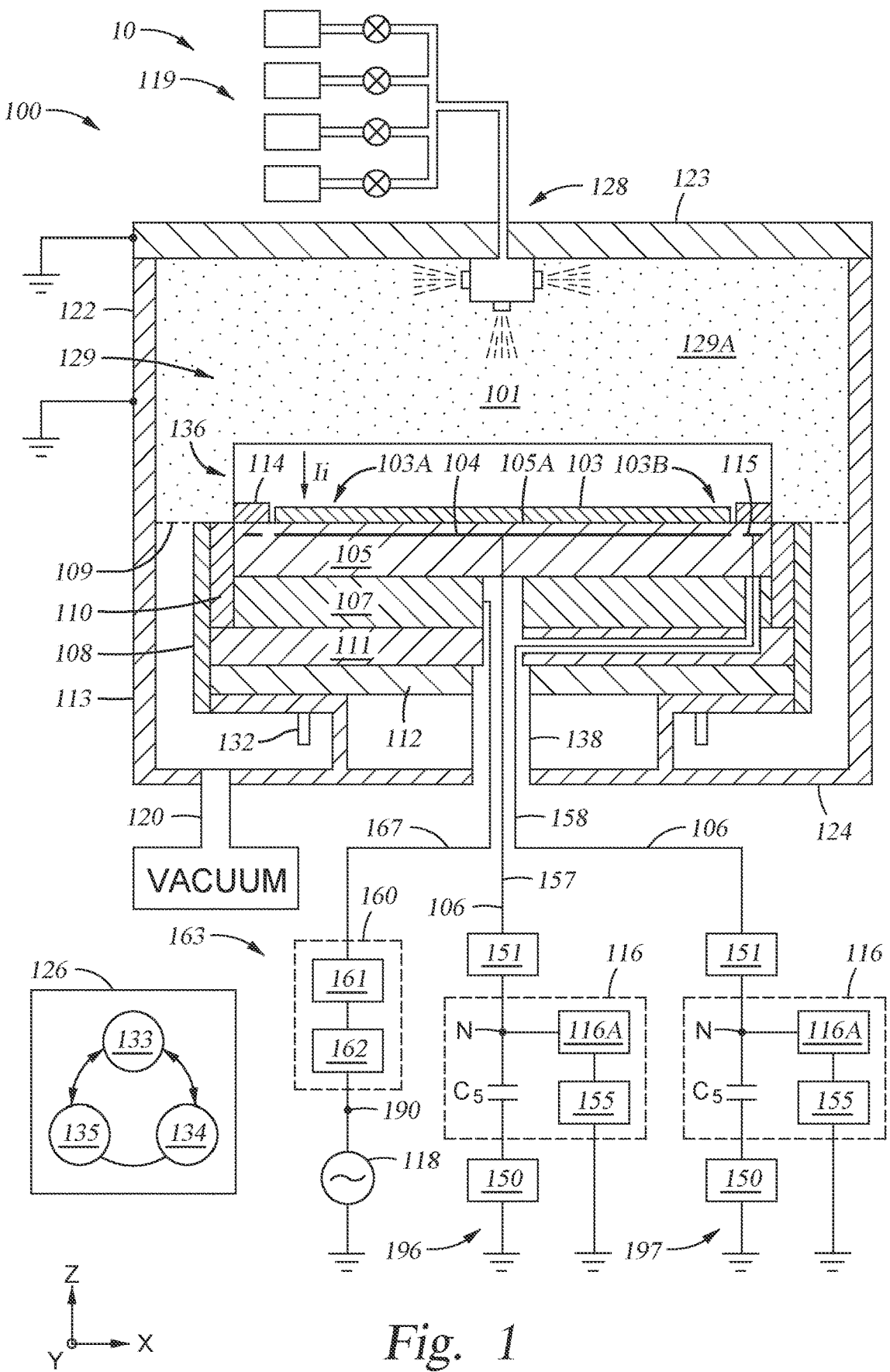
FIG. 1 is a schematic cross-sectional view of a processing system, according to one or more embodiments, configured to practice the methods set forth herein.

FIG. 1 is a schematic cross-sectional view of a processing system 10 configured to perform one or more of the plasma processing methods set forth herein. In some embodiments, the processing systems 10 is configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown, the processing system 10 is configured to form a capacitively coupled plasma (CCP), where the processing chamber 100 includes an upper electrode (e.g., chamber lid 123) disposed in a processing volume 129 facing a lower electrode (e.g., the substrate support assembly 136) also disposed in the processing volume 129. In a typical capacitively coupled plasma (CCP) processing system, a radio frequency (RF) source (e.g., RF generator 118) is electrically coupled to one of the upper or lower electrode, and delivers an RF signal configured to ignite and maintain a plasma (e.g., the plasma 101). In this configuration, the plasma is capacitively coupled to each of the upper and lower electrodes and is disposed in a processing region therebetween. Typically, the opposing one of the upper or lower electrodes is coupled to ground or to a second RF power source. One or more components of the substrate support assembly 136, such as the support base 107 is electrically coupled to a plasma generator assembly 163, which includes the RF generator 118, and the chamber lid 123 is electrically coupled to ground. As shown, the processing system 10 includes a processing chamber 100, a substrate support assembly 136, and a system controller 126.

The processing chamber 100 typically includes a chamber body 113 that includes the chamber lid 123, one or more sidewalls 122, and a chamber base 124, which collectively define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 disposed through the chamber lid 123 is used to deliver one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103.

The system controller 126, also referred to herein as a processing chamber controller, includes a central processing unit (CPU) 133, a memory 134, and support circuits 135. The system controller 126 is used to control the process sequence used to process the substrate 103, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10.

Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10 to perform the various process tasks and various process sequences used to implement the methods described herein. In one embodiment, the program includes instructions that are used to perform one or more of the operations described below in relation to FIG. 13.

The processing system may include a plasma generator assembly 163, a first pulsed voltage (PV) source assembly 196 for establishing a first PV waveform at a bias electrode 104, and a second PV source assembly 197 for establishing a second PV waveform at an edge control electrode 115. The first PV waveform or the second PV waveform may be generated using a waveform generator as described in more detail herein with respect to FIGS. 4-11. In some embodiments, the plasma generator assembly 163 delivers an RF signal to the support base 107 (e.g., power electrode or cathode) which may be used to generate (maintain and/or ignite) a plasma 101 in a processing region disposed between the substrate support assembly 136 and the chamber lid 123. In some embodiments, the RF generator 118 is configured to deliver an RF signal having a frequency that is greater than 1 MHz or more, or about 2 MHz or more, such as about 13.56 MHz or more.

As discussed above, in some embodiments, the plasma generator assembly 163, which includes an RF generator 118 and an RF generator assembly 160, is generally configured to deliver a desired amount of a continuous wave (CW) or pulsed RF power at a desired substantially fixed sinusoidal waveform frequency to a support base 107 of the substrate support assembly 136 based on control signals provided from the system controller 126. During processing, the plasma generator assembly 163 is configured to deliver RF power (e.g., an RF signal) to the support base 107 disposed proximate to the substrate support 105, and within the substrate support assembly 136. The RF power delivered to the support base 107 is configured to ignite and maintain a processing plasma 101 of processing gases disposed within the processing volume 129.

In some embodiments, the support base 107 is an RF electrode that is electrically coupled to the RF generator 118 via an RF matching circuit 162 and a first filter assembly 161, which are both disposed within the RF generator assembly 160. The first filter assembly 161 includes one or more electrical elements that are configured to substantially prevent a current generated by the output of a PV waveform generator 150 from flowing through an RF power delivery line 167 and damaging the RF generator 118. The first filter assembly 161 acts as a high impedance (e.g., high Z) to the PV signal generated from a PV pulse generator P1 within the PV waveform generator 150, and thus inhibits the flow of current to the RF matching circuit 162 and RF generator 118.

In some embodiments, the RF generator assembly 160 and RF generator 118 are used to ignite and maintain a processing plasma 101 using the processing gases disposed in the processing volume 129 and fields generated by the RF power (RF signal) delivered to the support base 107 by the RF generator 118. The processing volume 129 is fluidly coupled to one or more dedicated vacuum pumps through a vacuum outlet 120, which maintain the processing volume 129 at sub-atmospheric pressure conditions and evacuate processing and/or other gases, therefrom. In some embodiments, the substrate support assembly 136, disposed in the processing volume 129, is disposed on a support shaft 138 that is grounded and extends through the chamber base 124. However, in some embodiments, the RF generator assembly 160 is configured to deliver an RF power to the bias electrode 104 disposed in the substrate support 105 versus the support base 107.

The substrate support assembly 136, as briefly discussed above, generally includes the substrate support 105 (e.g., ESC substrate support) and support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing.

Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof. In some embodiments, one or more characteristics of the RF power used to maintain the plasma 101 in the processing region over the bias electrode 104 are determined and/or monitored by measuring an RF waveform established at the bias electrode 104.

In one configuration, the bias electrode 104 is a chucking pole used to secure (i.e., chuck) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

In some embodiments, the bias electrode 104 is electrically coupled to a clamping network 116, which provides a chucking voltage thereto, such as static DC voltage between about −5000 V and about 5000 V, using an electrical conductor, such as the coaxial power delivery line 106 (e.g., a coaxial cable). As will be discussed further below, the clamping network 116 includes bias compensation circuit elements 116A, a DC power supply 155, and a bias compensation module blocking capacitor, which is also referred to herein as the blocking capacitor $C_5$. The blocking capacitor $C_5$ is disposed between the output of a pulsed voltage (PV) waveform generator 150 and the bias electrode 104.

The substrate support assembly 136 may further include the edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 1, the edge control electrode 115 is positioned within a region of the substrate support 105. In some embodiments, as illustrated in FIG. 1, the edge control electrode 115 includes a conductive mesh, foil, and/or plate that is disposed a similar distance (i.e., Z-direction) from the substrate supporting surface 105A of the substrate support 105 as the bias electrode 104. In some other embodiments, the edge control electrode 115 includes a conductive mesh, foil, and/or plate that is positioned on or within a region of a quartz pipe 110, which surrounds at least a portion of the bias electrode 104 and/or the substrate support 105. Alternately, in some other embodiments (not shown), the edge control electrode 115 is positioned within or is coupled to the edge ring 114, which is disposed on and adjacent to the substrate support 105. In this configuration, the edge ring 114 is formed from a semiconductor or dielectric material (e.g., AlN, etc.).

The edge control electrode 115 can be biased by use of a PV waveform generator that is different from the PV waveform generator 150 that is used to bias the bias electrode 104. In some embodiments, the edge control electrode 115 can be biased by use of a PV waveform generator 150 that is also used to bias the bias electrode 104 by splitting part of the power to the edge control electrode 115. In one configuration, a first PV waveform generator 150 of the first PV source assembly 196 is configured to bias the bias electrode 104, and a second PV waveform generator 150 of a second PV source assembly 197 is configured to bias the edge control electrode 115.

A power delivery line 157 electrically connects the output of the PV waveform generator 150 of the first PV source assembly 196 to an optional filter assembly 151 and the bias electrode 104. While the discussion below primarily discusses the power delivery line 157 of the first PV source assembly 196, which is used to couple a PV waveform generator 150 to the bias electrode 104, the power delivery line 158 of the second PV source assembly 197, which couples a PV waveform generator 150 to the edge control electrode 115, will include the same or similar components. The electrical conductor(s) within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e). The optional filter assembly 151 includes one or more electrical elements that are configured to substantially prevent a current generated by the output of the RF generator 118 from flowing through the power delivery line 157 and damaging the PV waveform generator 150. The optional filter assembly 151 acts as a high impedance (e.g., high Z) to RF signal generated by the RF generator 118, and thus inhibits the flow of current to the PV waveform generator 150.

The second PV source assembly 197 includes a clamping network 116 so that a bias applied to the edge control electrode 115 can be similarly configured to the bias applied to the bias electrode 104 by the clamping network 116 coupled within the first PV source assembly 196. Applying similarly configured PV waveforms and clamping voltages to the bias electrode 104 and edge control electrode 115 can help improve the plasma uniformity across the surface of the substrate during processing and thus improve the plasma processing process results.

In some embodiments, the processing chamber 100 further includes the quartz pipe 110, or collar, that at least partially circumscribes portions of the substrate support assembly 136 to prevent the substrate support 105 and/or the support base 107 from contact with corrosive processing gases or plasma, cleaning gases or plasma, or byproducts thereof. Typically, the quartz pipe 110, the insulator plate 111, and the ground plate 112 are circumscribed by a cathode liner 108. In some embodiments, a plasma screen 109 is positioned between the cathode liner 108 and the sidewalls 122 to prevent plasma from forming in a volume underneath the plasma screen 109 between the cathode liner 108 and the one or more sidewalls 122.

Example Representative Circuit of a Processing Chamber

Figure 2:
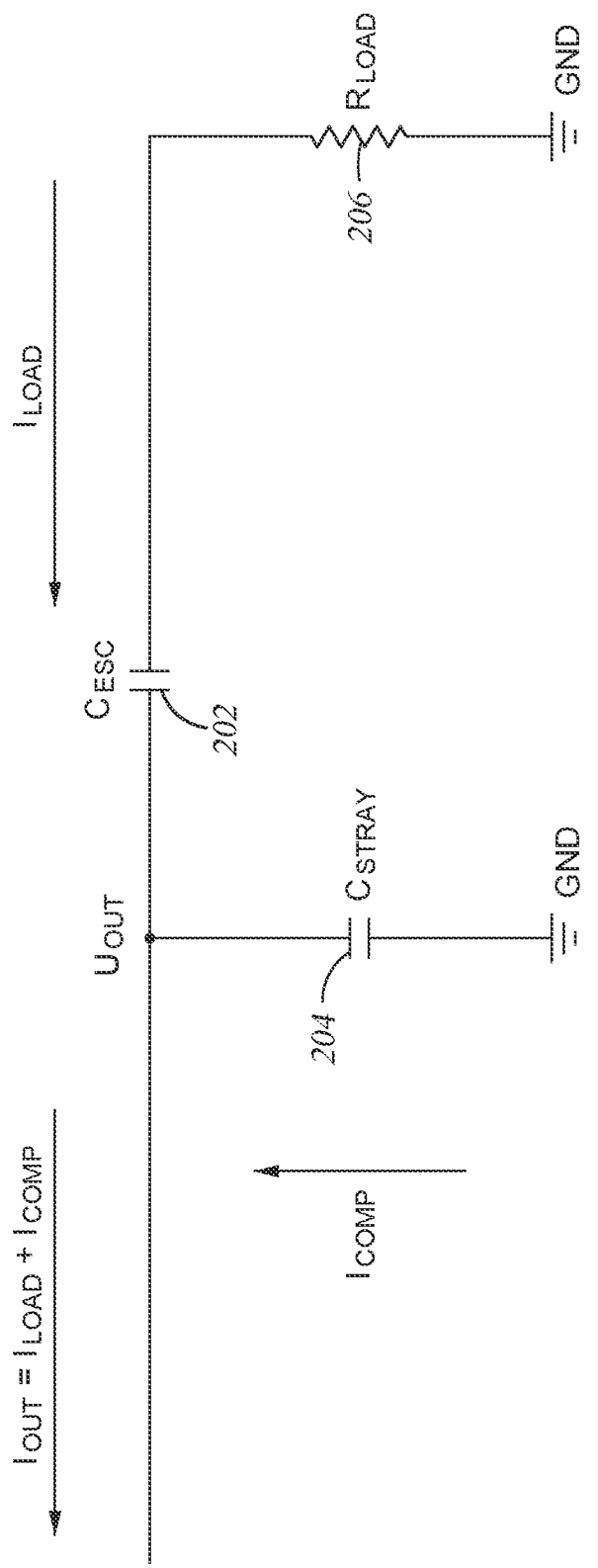
FIG. 2 illustrates stray capacitance and substrate support capacitance associated with a processing chamber.

FIG. 2 illustrates stray capacitance and escape capacitance associated with a processing chamber. The stray capacitance 204 ($C_{stray}$) represents the capacitance between an electrode of the processing chamber and ground, and a substrate support capacitance 202, also referred to herein as an electrostatic chuck capacitance ($C_{esc}$), which represents the capacitance between the bias electrode 104 and the substrate supporting surface 105A. As shown, $C_{esc}$ is created between an output node (labeled $U_{out}$) and a complex load (e.g., plasma load) which is simply represented by resistive element 206. To have a square shape for a voltage pulse on the load (e.g., at node $U_{load}$), a slope is implemented for the voltage across $C_{esc}$ and the voltage across $C_{stray}$ (e.g., voltage at $U_{out}$), as described in more detail herein. The current across $C_{stray}$ (e.g., compensation current ($I_{comp}$)) may be equal to the load current ($I_{load}$) across $C_{esc}$ multiplied by the ratio of the capacitance of $C_{stray}$ and the capacitance of $C_{esc}$. The output current ($I_{out}$) may be equal to the sum of $I_{load}$ and Icomp, which may be represented by the equation:

$$Iout = Iload\left(1 + \frac{Cstray}{Cesc}\right)$$

Example Voltage Waveform for Processing Chamber

Figure 3A:
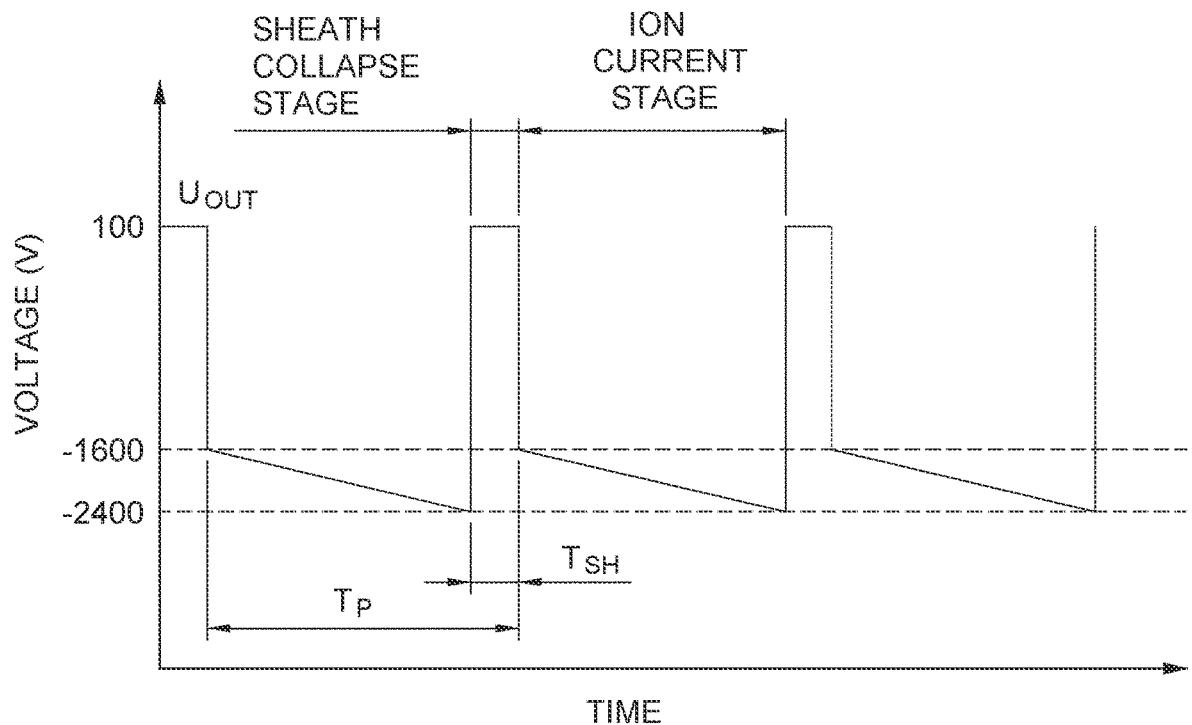
FIGS. 3A, 3B, and 3C illustrate examples of voltage waveforms that can be provided during plasma processing.
Figure 3B:
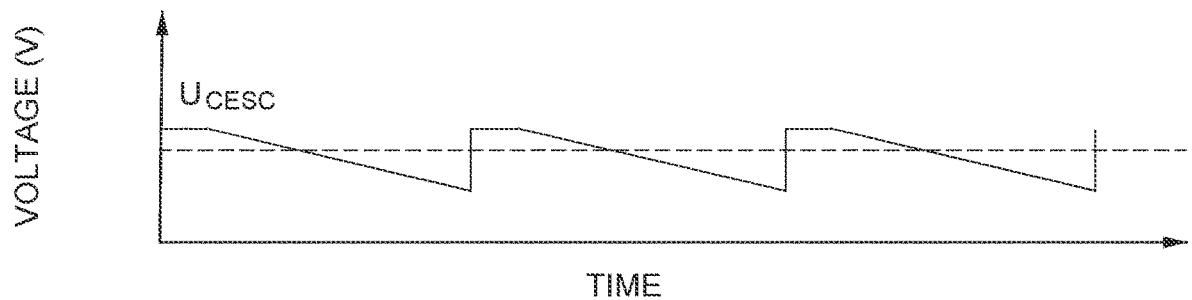
Figure 3C:
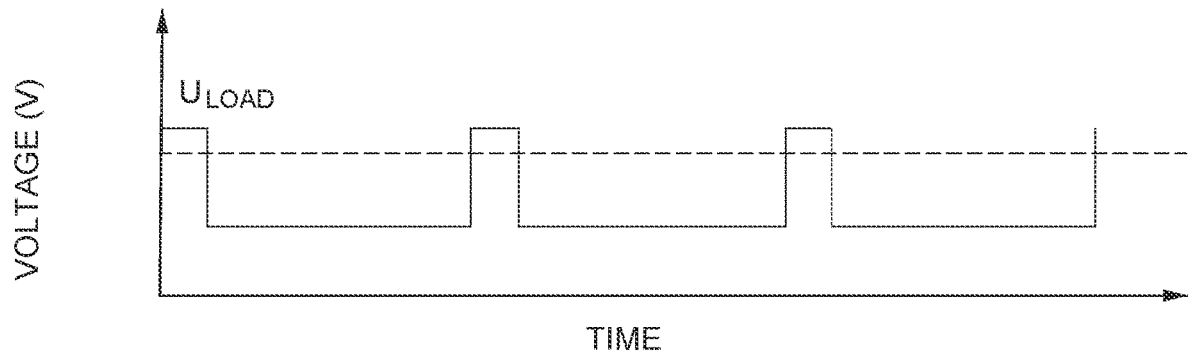

FIG. 3A illustrates an example of a voltage waveform that may be delivered to an electrode disposed within a processing chamber, such as the bias electrode 104 shown in FIG. 1. The waveform generally includes two main stages, an ion current stage and a sheath collapse stage. At the beginning of the ion current stage, a drop of wafer voltage creates a high voltage sheath above the substrate, accelerating positive ions to the substrate 103. The positive ions deposit a positive charge on the substrate surface and tend to gradually increase the substrate voltage positively. If a square wave is supplied, the ion current towards the substrate creates a positive slope of the substrate voltage (e.g., at $U_{load}$ shown in FIG. 2). To have a square shape for the voltage pulse on the load (e.g., at $U_{load}$) as shown in FIG. 3C, a negative slope is implemented for the voltage at $U_{out}$ during the ion current stage, as shown in FIG. 3A, is used to form the voltage across the electrostatic chuck capacitive element $C_{esc}$, as shown in FIG. 3B. FIG. 3C illustrates an example of a desirable voltage waveform that may be established at a substrate disposed on the substrate support assembly 136 disposed within the processing chamber 100. Implementing the slope at the bias electrode 104 and electrostatic chuck capacitor $C_{esc}$ during the ion current stage is generally referred to as current compensation, which is used to form the constant voltage seen at $U_{load}$ during this stage. The voltage difference between the beginning and end of the ion current phase determines the ion energy distribution function (IEDF) width. The larger the voltage difference, the wider the distribution of ion energies, and thus a wider IEDF width. To achieve monoenergetic ions and a narrower IEDF width, current compensation operations are performed to flatten the substrate voltage waveform in the ion current phase. In some embodiments, the voltage waveforms can be delivered at a frequency ($1/T_p$) between about 50 KHz and 1000 KHz. In some embodiments, voltage waveform established at the electrode has an on-time, which is defined as the ratio of the ion current time period (e.g., length of ion current stage) and the waveform period $T_P$ (e.g., length of sheath collapse stage+length of ion current stage), is greater than 50%, or greater than 70%, such as between 80% and 95%. In some embodiments, a voltage waveform, which has a waveform cycle has a period $T_P$ (e.g., about 2.5 μs), is serially repeated within a waveform burst that has a burst period that is between about 100 microseconds (μs) and about 10 milliseconds (ms). The burst of PV waveforms can have a burst duty cycle that is between about 5%-100%, such as between about 50% and about 95%, wherein the duty cycle is the ratio of the burst period divided by the burst period plus a non-burst period (i.e., no PV waveforms are generated) that separates the burst periods. As shown, the sheath collapse stage may have a duration of $T_{SH}$, which may be about 200 ns.

Waveform Generator Examples

Figure 4:
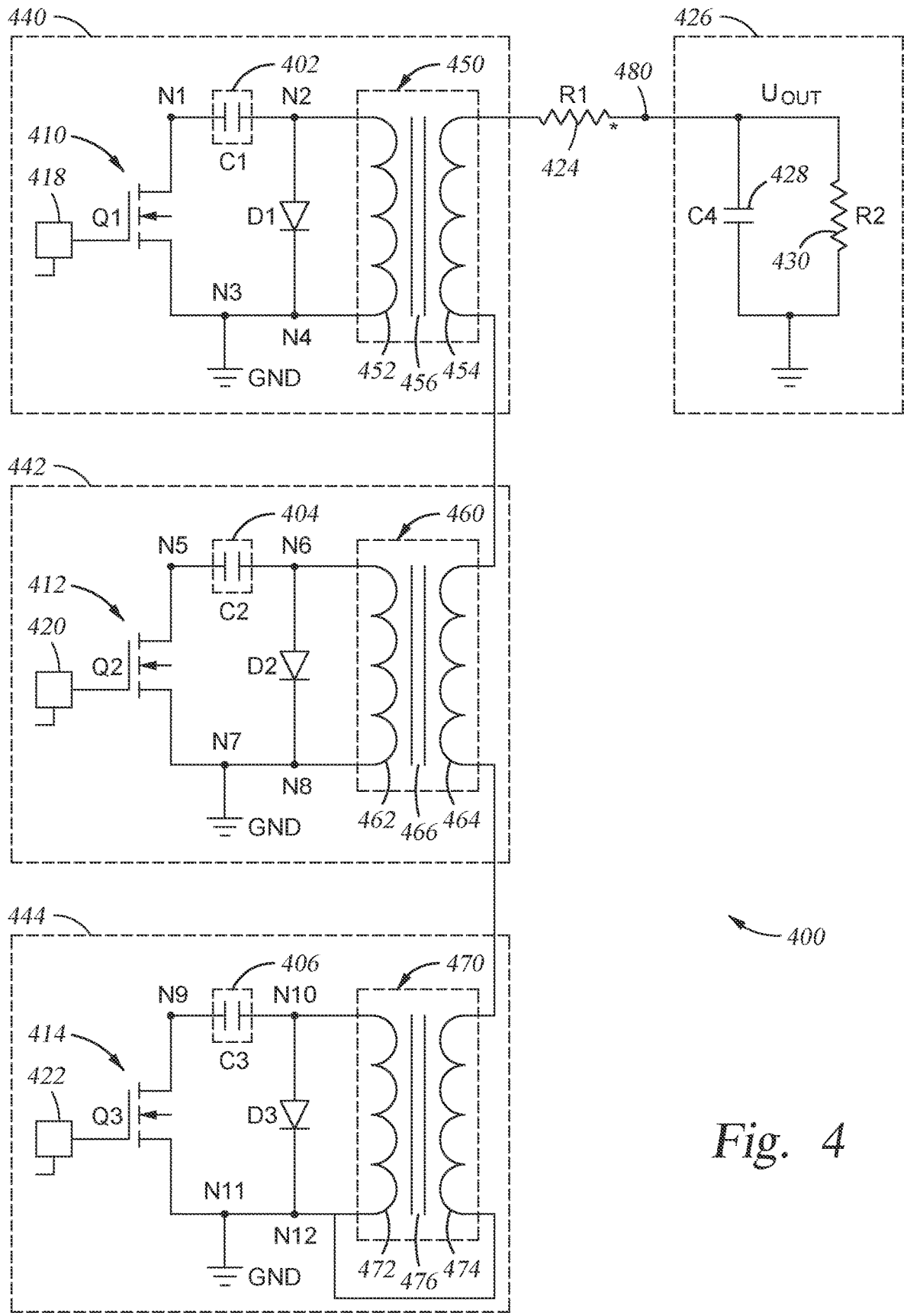
FIG. 4 illustrates a schematic view of a pulser, in accordance with certain embodiments of the present disclosure.
Figure 6:
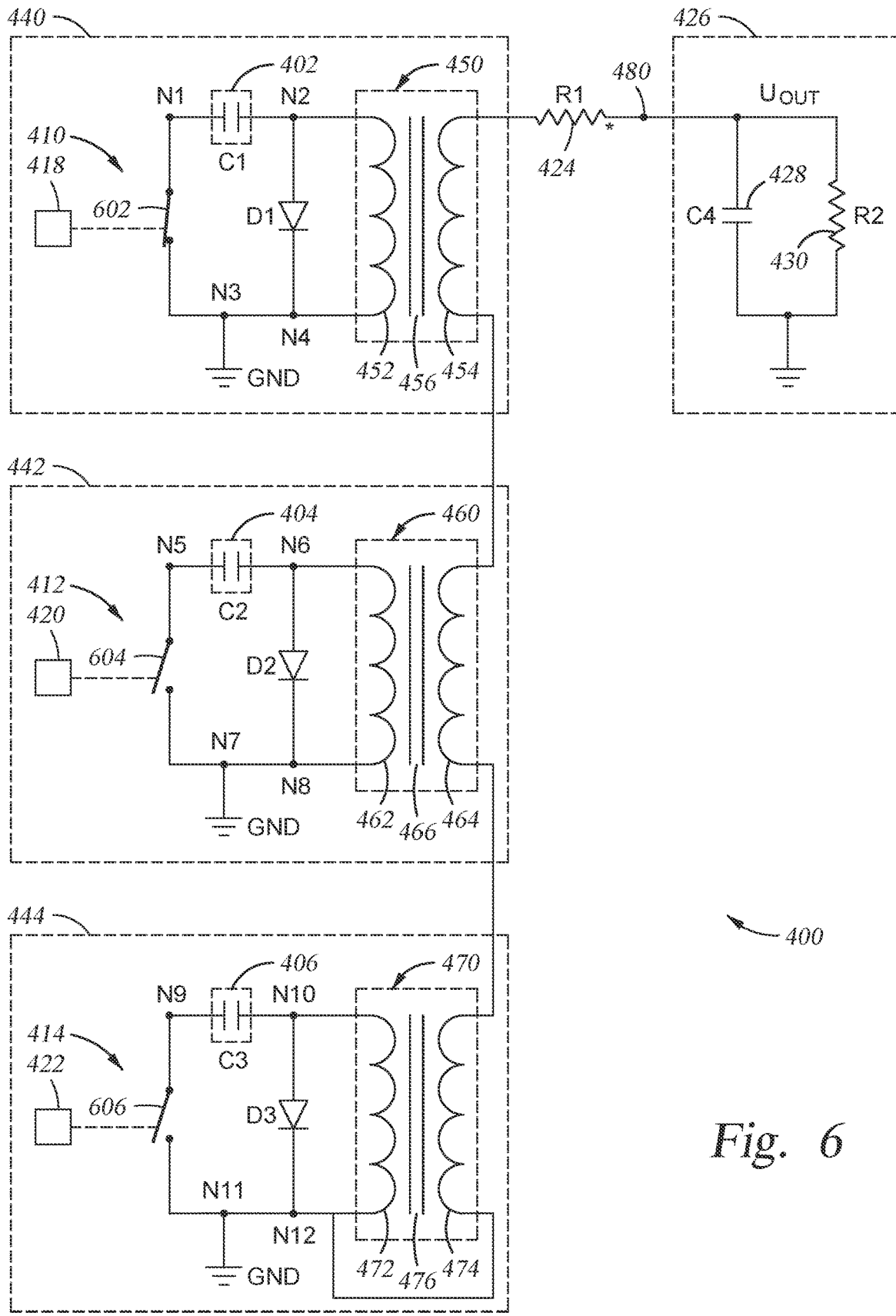
FIG. 6 illustrates a simplified schematic representation of a mode of operation of a pulser, in accordance with certain embodiments of the present disclosure.
Figure 12:
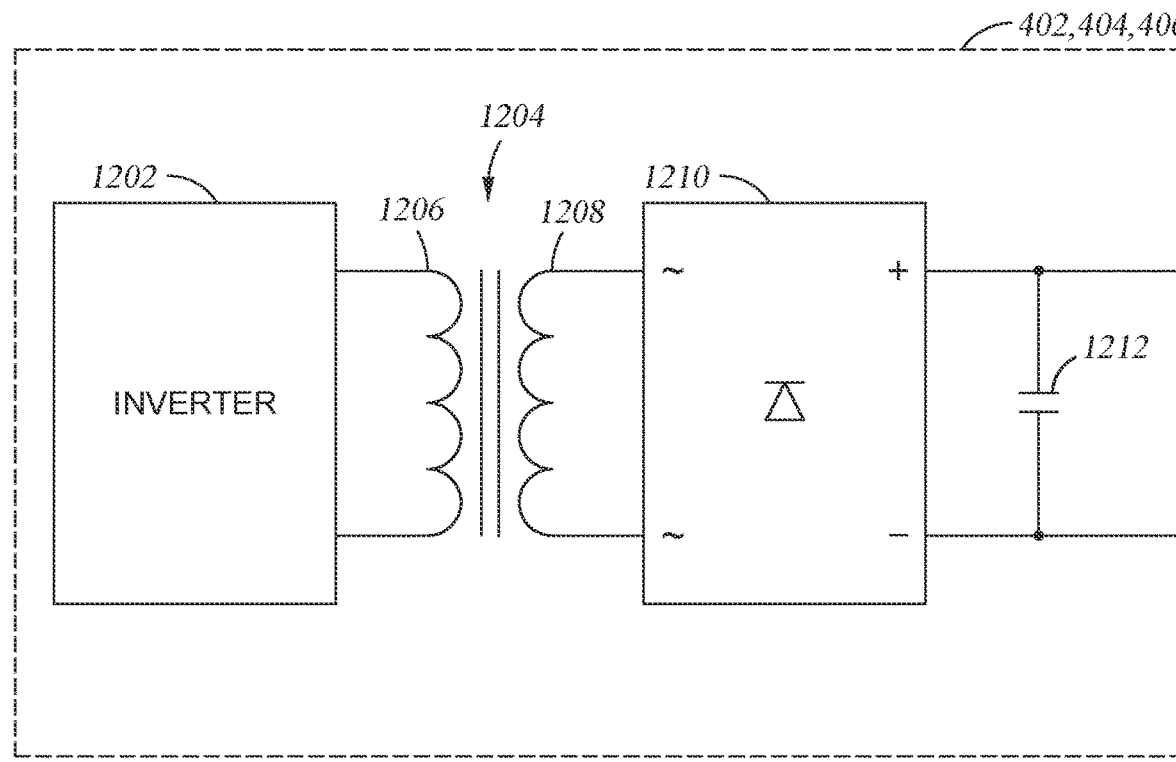
FIG. 12 illustrates a charging circuit used to charge a capacitive element, in accordance with certain aspects of the present disclosure.

FIG. 4 illustrates a pulser 400 (also referred to herein as a waveform generator), in accordance with certain embodiments of the present disclosure. In some embodiments, the pulser 400, may be included in a power supply (e.g., PV waveform generator 150). As shown, the pulser 400 includes a number of stacked inductive adder modules (e.g., 440, 442, 444), and may include pulse capacitive elements 402, 404, and 406 (labeled C1, C2, C3, and C4), as well as transistors 410, 412, and 414 (labeled as Q1, Q2, and Q3). Transistors 410, 412, and 414 may be power transistors (e.g., metal-oxide-semiconductor field-effect transistors (MOSFETs)) with a parallel diode (e.g., a body diode D1, D2, and D3). Each transistor 410, 412, 414 may act as a switch, and may be referred to as a switch herein. In some embodiments, transistor 410, 412, 414 may be implemented on a printed circuit board. Capacitive elements 402, 404, and 406 may serve as voltage storage elements that may be charged using a charging circuit, such as the circuit illustrated in FIG. 12. In some embodiments, the transistors 410, 412, and 414 may each be coupled to a gate drive circuit 418, 420, 422. Each gate drive circuit 418, 420, 422 may have a trigger, which may receive a signal from the system controller 126 in order to be enabled or disabled to set the state of the gate within the respective transistor 410, 412, 414. The capacitive elements illustrated in FIGS. 4, 6 and 12, are in effect acting as voltage sources. While the example pulser 400 illustrates capacitive elements to facilitate understanding, any suitable voltage source may be used.

The resistive element 424 (labeled R1) represents an internal serial resistive element of the pulser coupled to the load 426. The complex load 426, which may be formed by a plasma formed in plasma processing chamber, may be represented by capacitive element 428 (labeled C4) and resistive element 430 (labeled R2). As shown, the capacitive element 406 and transistor 414 form a first voltage stage 444 (e.g., module), and the capacitive element 404 and transistor 412 form a second voltage stage 442 (e.g., module). The pulser 400 also includes a third voltage stage 440 (e.g., module) having the capacitive element 402 and transistor 410. The output of the pulser 400 is coupled to a common node 480 that is coupled (e.g., capacitively coupled) to the complex load 426. While the pulser 400 is implemented with three voltage stages, the aspects of the present disclosure may be implemented with one, two, or more than three voltage stages. In some embodiments of a pulser 400, one or more of the voltage stages may be duplicated one or more times, such as a configuration that includes a first voltage stage 444, two or more second voltage stages 442, and a third voltage stage 440.

In some embodiments, the common node 480 and the load 426 are configured to be capacitively coupled to the support base 107, due to the delivery of RF power, provided to the support base 107, by the RF source 118. In some embodiments, the common node 480 may be configured to be capacitively coupled to a cathode RF feed provided through node 190 (FIG. 1). During plasma processing, the plasma 101 will act as the complex load 426.

In some embodiments, and as shown in FIG. 4, the pulser 400 may include a first voltage stage 444. The first voltage stage 444 has a first switch (e.g., combination of transistor 414, gate drive circuit 422, and trigger) with a first terminal coupled to a first terminal of a first voltage source (e.g., capacitive element 406) at node N9. A second terminal of the first switch is coupled to a ground reference at node N11. The first voltage stage 444 may further include a first transformer 470 with a core 476, a primary winding 472 coupled to a second terminal of the first voltage source 406 at node N10, and a secondary winding 474 with a first end coupled to the first ground reference via node N12. The primary winding of the first transformer is also coupled to the ground reference at node N11. The first voltage stage 444 may further include a first diode D3 in parallel with the primary winding 472 of the first transformer 470. A first end of the diode D3 may be coupled to the second terminal of the first voltage source 406 and the primary winding at node N10, and a second end of the diode D3 may be coupled to first terminal of the first switch 414 and the primary winding via node N12. The first transformer may have a first transformer ratio. The ratio of the transformer is the ratio between the number of primary turns ($W_p$) in the primary winding 472 to the number of secondary turns ($W_s$) in the secondary windings 474 with respect to each other. The transformer ratio (i.e., $W_p:W_s$) produces either a step-up voltage transformer (i.e., $W_s>W_p$) or a step-down voltage transformer (i.e., $W_s<W_p$).

In some embodiments, and as shown in FIG. 4, the pulser 400 may include a second voltage stage 442. The second voltage stage 442 has a second switch (e.g., combination of transistor 412, gate drive circuit 420, and trigger) with a first terminal coupled to a first terminal of a second voltage source (e.g., capacitive element 404) at node N5. A second terminal of the second switch is coupled to a second ground reference at node N7. The second voltage stage 442 may further include a second transformer 460 with a core 466, a primary winding 462 coupled to a second terminal of the second voltage source 404 at node N6, and a first end of a secondary winding 464 that is coupled to a second end of the secondary winding 474 of the first transformer 470. The primary winding of the second transformer 460 is also coupled to the ground reference at node N7. The second voltage stage 442 may further include a second diode D2 in parallel with the primary winding 462 of the second transformer 460. A first end of the diode D2 may be coupled to the second terminal of the second voltage source 404 and the primary winding at node N6, and a second end of the diode D2 may be coupled to first terminal of the second switch 412 and the primary winding via node N8. The second transformer 460 may have a second transformer ratio, as described above. In some embodiments of the pulser 400, such as a configuration where there are only two voltage stages (i.e., voltage stages 442 and 444), a second end of the secondary winding 464 of the second transformer 460 may be configured to be coupled to an electrode disposed within the processing chamber 100, such as the biasing electrode 104 through the common node 480

In some embodiments, and as shown in FIG. 4, the pulser 400 may include a third voltage stage 440. The third voltage stage 440 has a third switch (e.g., combination of transistor 410, gate drive circuit 418, and trigger) with a first terminal coupled to a first terminal of a third voltage source (e.g., capacitive element 402) at node N1. A second terminal of the third switch is coupled to a third ground reference at node N3. The third voltage stage 440 may further include a third transformer 450 with a core 456, a primary winding 452 coupled to a second terminal of the third voltage source 402 at node N2, and a secondary winding 454 that has a first end coupled to the second end of the secondary winding 464 of the second transformer 460. The primary winding of the third transformer is also coupled to the ground reference at node N3. The third voltage stage 440 may further include a third diode D1 in parallel with the primary winding 452 of the third transformer 450. A first end of the diode D1 may be coupled to the second terminal of the third voltage source 402 and the primary winding at node N2, and a second end of the diode D1 may be coupled to first terminal of the third switch 410 and the primary winding via node N4. The third transformer may have a third transformer ratio, as is described above. In some embodiments of the pulser 400, as shown in FIG. 4, a second end of the secondary winding 454 of the third transformer 450 may be configured to be coupled to an electrode disposed within the processing chamber 100, such as the biasing electrode 104 through the common node 480.

In some embodiments, the core (e.g., 456, 466, 476) utilized in the transformers 450, 460, 470 of the modules 440, 442, 444 of the pulser 400 are used to adjust the output waveform that is possible for the pulser 400. The characteristics of the core (e.g., 456, 466, 476) dictate the maximum allowable switching frequency and pulse width of the output waveform that can be created by the pulser 400. Some of the characteristics of a core (e.g., 456, 466, 476) that can have an impact on the output waveform that is created by the pulser 400 include magnetic saturation flux density, magnetic flux swing, remnant flux density, cross sectional area, volume, and weight. In some embodiments, each of the cores (e.g., 456, 466, 476) has at least one of a magnetic saturation flux density of between 1.4 tesla (T) and 1.8 T, a magnetic flux swing of between 2.4 T and 3.6 T, a remnant flux density of between 0.2 T and 0.8 T, a cross sectional area of between 6 square centimeters (cm$^2$) and 9 cm$^2$, a weight of between 2 kilograms (kg) and 4 kg, and a volume of between 700 cubic centimeters (cm$^3$) and 1500 cm$^3$.

In some embodiments, different cores (e.g., 456, 466, 476) may be used in different modules 440, 442, 444 of the pulser 400 in order to customize the characteristics of the output waveform. In some embodiments, each module 440, 442, 444 has its own ground reference. In some embodiments, the first, second and third transformer ratios in each the transformers 450, 460, 470 are the same. In other embodiments, one or more of the transformers in a pulser 400 has a different transformer ratio from the other transformers in the other stages within the pulser 400. In addition, each module being ground referenced also may reduce isolation breakdown (e.g., arcing) between the gate drive circuits at higher voltages, which can prove problematic in certain conventional pulser designs. In some embodiments, the output of each module 440, 442, 444 is tied to the same ground reference as the gate drive circuit input, so the pulser 400 may suffer less from electromagnetic interference during operation.

In some embodiments, the transformer ratio (i.e., first transformer ratio) of the first transformer may be the same as the transformer ratio (i.e., second transformer ratio) of the second transformer. In other embodiments, the transformer ratio of the first transformer may be different than the transformer ratio of the second transformer. For example, the first transformer ratio may be smaller than the second transformer ratio, or larger than the second transformer ratio. In some embodiments, the transformer ratio (i.e., third transformer ratio) of the third transformer may be the same as the transformer ratio of the first transformer and the second transformer. In other embodiments, the transformer ratio of the third transformer may be different than the transformer ratio of the first transformer and the second transformer. There may be any combination of transformer ratios among the transformers for each voltage stage 440, 442, 444 (e.g., module). The transformer ratio of the transforms may be modified to customize the output voltage waveshape of the pulser 400 with different voltages and different pulse widths. Each module 440, 442, 444 can deliver a pulse, and each pulse seen at the common node 480 is dependent on the voltage stored in the capacitors 402, 404, 406 of the respective modules and the transformer ratio. Triggering multiple modules of a pulser 400 with varying transformer ratios may allow for the output signal shape and pulse width generated in the secondary windings of the modules to be modified to suit a desired IEDF. In some embodiments, the transformers (e.g., 450, 460, 470) of each of the voltage stage 440, 442, 444 (e.g., module) are connected in series.

As shown, each of the capacitive elements 402, 404, and 406 may be charged to a specific voltage, depending on the characteristics of the waveform being implemented. The transistor, gate drive circuit, and trigger in each module 440, 442, 444 may operate as a switch, controlled by the system controller 126. For example, each of the capacitive elements 402, 404, and 406 are charged to 800 volts when the gate drive circuit, and the trigger (e.g., transistor 410, 412, 414) in each module 440, 442, 444 operates as a closed switch. In some implementations, the capacitive elements 402, 404, and 406 may be charged to greater or lower voltages to implement different voltages levels for a waveform suitable for different implementations. In some embodiments, each of the voltage stages 440, 442, and 444 may have a modular design that facilitates easy replacement in case of malfunction. The operation of the pulser 400 for generating the waveform shown in FIG. 3A is described in more detail with respect to FIG. 6-11.

Generated Voltage Waveform Examples

In some embodiments, transistors 410, 412, and 414 may be triggered by a gate signal in different time instances, to increase the switching frequency and address the limited switching frequency of the commercial transistors in the delivery of voltage pulses in various processing applications, such as plasma etching applications. In this manner, output voltages can be obtained at different time stamps, thereby increasing the effective switching frequency at the output (e.g., common node 480) and effectively working around the switching frequency limitation of typical commercial transistors. In some embodiments, some of the parameters of the gate signal that is applied to the transistors 410, 412, and 414 may be changed. For example, the trigger gate signal start time and/or trigger gate signal width may be modified to enable output voltages with different waveform characteristics to be produced, as illustrated and described herein. In some embodiments, multiple different DC power modules that enable output voltages with different amplitudes at an electrode within the processing chamber 100 may be coupled to modules 440, 442, and 444, for example, at the common node 480, which is coupled to the biasing electrode 104, is capacitively coupled to the complex load 426. In some embodiments, the varying duty cycle ratios among modules 440, 442, and 444 can lead to output voltages with different peak amplitudes in a pulse. In addition, the gate signals applied to the modules 440, 442, and 444 may triggered in such a way as to create overlap in the generated voltage waveform, which may assist in enabling a more preferred IEDF of the output waveform.

Figure 5A:
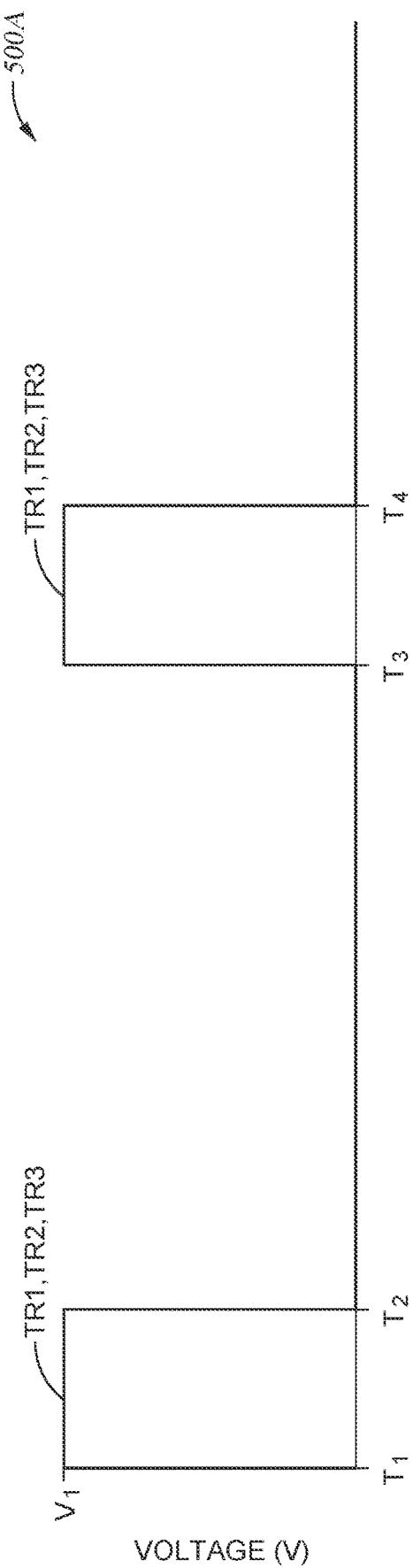
FIG. 5A is a graph showing states of switches of the pulser during various modes of operation, in accordance with certain embodiments of the present disclosure.
Figure 5B:
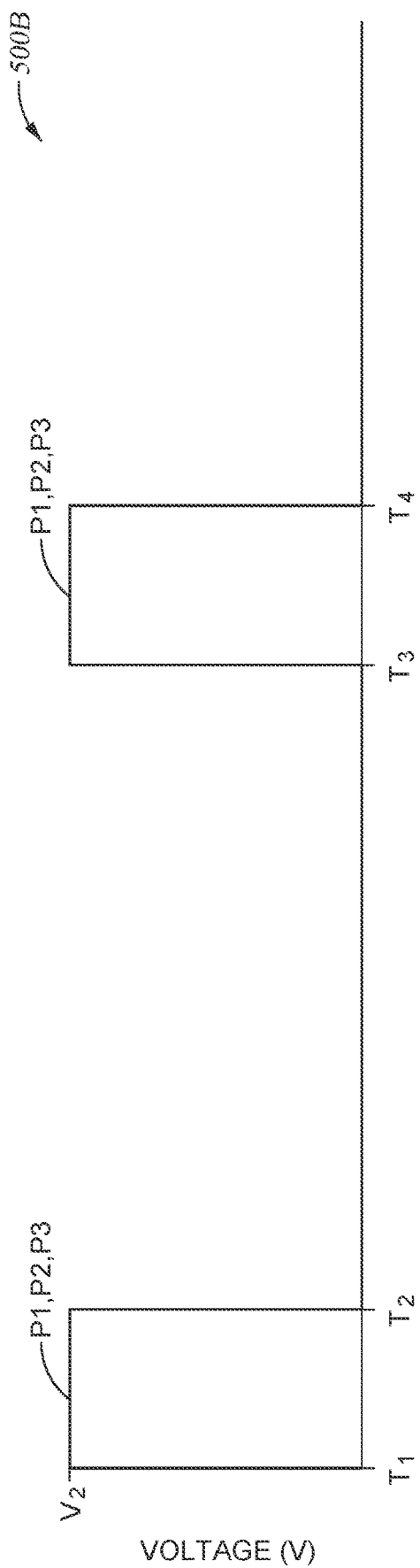
FIG. 5B is a graph showing an output provided by the pulser during the mode of operation illustrated in FIG. 5A, in accordance with certain embodiments of the present disclosure.

FIG. 5A is a graph showing states of switches (e.g., transistors 410, 412, 414) and the generated voltage of a pulser 400 during a mode of operation, in accordance with certain embodiments of the present disclosure. The magnitudes of the voltage associated with the various modes of operation and circuit elements illustrated in FIGS. 5-11D are intended to provide examples of voltages that may be established during the generation of a pulsed waveform and are not intended to be limiting as to the scope of the disclosure provided herein. Graph 500A is a diagram showing the state of each of the transistors 410, 412, and 414 (e.g., Q1, Q2, Q3) when a gate signal (e.g., trigger) is applied to each of their respective gate drive circuits 418, 420 422 simultaneously (e.g., gate driver 418 triggers transistor 410, gate driver 420 triggers transistor 412, gate driver 422 triggers transistor 414). The applied gate signal may be a Transistor-Transistor Logic (TTL) signal, and may be between 1.5V and 5V. In some embodiments, the system controller 126 may control application of a gate signal to the gate drive circuits 418, 420 422 to activate the transistors 410, 412, and 414 of the modules 440, 442, and 444. In graph 500A in FIG. 5A, a gate signal (e.g., $V_1$) is applied simultaneously (e.g., between times $T_1$ and $T_2$) to each of the modules 440, 442, and 444, respectively, and each module generates a pulse trigger TR1, TR2, TR3. Module 440 generates pulse TR1, module 442 generates pulse TR2, and module 444 generates pulse TR3. Graph 500B shown in FIG. 5B illustrates the voltage (e.g., $V_2$) seen at the common node 480 between times $T_1$ and $T_2$ as a result of the generated pulses P1, P2, P3. The pulse may be repeated during interval $T_3$ and $T_4$ as illustrated. Triggering multiple modules of a pulser 400 simultaneously may allow for the output voltage at the common node 480 (e.g., voltage at load 426) to be increased. For example, if each module of the pulser generated a 1200V pulse in the secondary winding portion of each transformer 450, 460, 470, then the electrode coupled to the common node 480 would see 3600V, as the voltages of each of the simultaneous pulses P1, P2, P3 would be added together.

FIG. 6 illustrates a further simplified schematic of the pulser 400 that is illustrated in FIG. 4, and illustrates an example of a mode of operation of a pulser 400, in accordance with certain embodiments of the present disclosure. The mode of operation and circuit elements illustrated in FIG. 6 illustrates an example of how different voltages may be established during different times during the generation of a pulsed waveform, and thus is not intended to be limiting as to the scope of the disclosure provided herein. Other embodiments may include other combinations of modules 440, 442, and 444 being triggered simultaneously or at different times by their respective gate drive circuits 418, 420, and 422, in order to generate desired voltages at the common node 480 at different times during processing. In the example illustrated in FIG. 6, the transistors 410, 412, and 414 are represented by and functionally operate as switches. In this example, only a gate drive 418 of the module 440 is triggered by a gate signal command provided by the system controller 126 and thus the switch representing the transistor 410 is closed. In this example, the gate drive circuit 420 of the second module 442 and the gate drive circuit 422 of the third module 444 are not triggered by a gate signal command provided by the system controller 126, and thus the switches representing the transistors 412 and 414 remain open.

FIG. 7A is a graph showing states of a transistors 410 (e.g., Q1) of the pulser 400 during the mode of operation illustrated in the schematic configuration illustrated in FIG. 6, in accordance with certain embodiments of the present disclosure. In FIGS. 5A, 5B, and 7A-9B, $V_1$ represents a gate signal, which may be a TTL signal (e.g., between 1.5V and 5V), and $V_2$ represents the output voltage, which may be adjusted as described herein. As described above, applying a switching signal (e.g., gate signal) closes a switch (e.g., transistor 410) to enable the generation of a pulse. Graph 700A in FIG. 7A illustrates the state of the transistor 410 when a gate signal is applied to the transistors by the gate drive circuit 418 (e.g., between times $T_1$ and $T_2$). In graph 700A, a gate signal (e.g., $V_1$) is applied to the gate drive circuit 418 in module 440 as a trigger pulse TR1, and thus only the triggered module 440 generates a pulse P1, which is illustrated in FIG. 700B. Graph 700B shown in FIG. 7B illustrates the voltage (e.g., $V_2$) seen at the common node 480 between times $T_1$ and $T_2$ as a result of the generated voltage pulse P1 by the module 440. In contrast to the example above, where multiple modules of a pulser 400 are triggered simultaneously, triggering only a single module generates a smaller output voltage, because the other modules are not generating a pulse voltage at the same time. When more than one module is generating a pulse voltage simultaneously, the generated pulses will be added together due to the serial connection of the secondary windings of each module that extends from the ground connected at node N11 to the common node 480. Thus, in some embodiments, a pulser using multiple modules simultaneously may be able to generate a higher pulse than a pulser using only a single module. As shown in FIG. 7B, the pulse may be repeated during interval $T_3$ and $T_4$. For example, if each module of the pulser is configured to generate a 1200V pulse in the secondary winding connected to each module, then the common node 480 would see only 1200V in this example, as only one module (e.g., module 440) is commanded to generate a pulse.

Figure 8A:
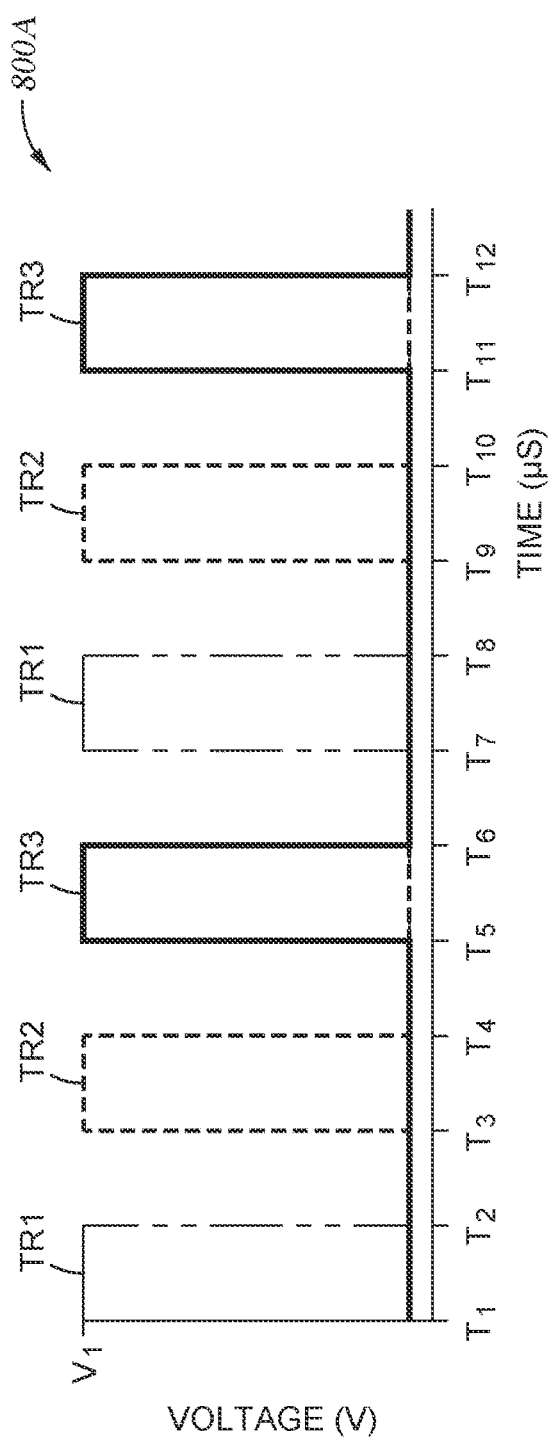
FIG. 8A is a graph showing states of switches of the pulser during various modes of operation, in accordance with certain embodiments of the present disclosure.
Figure 8B:
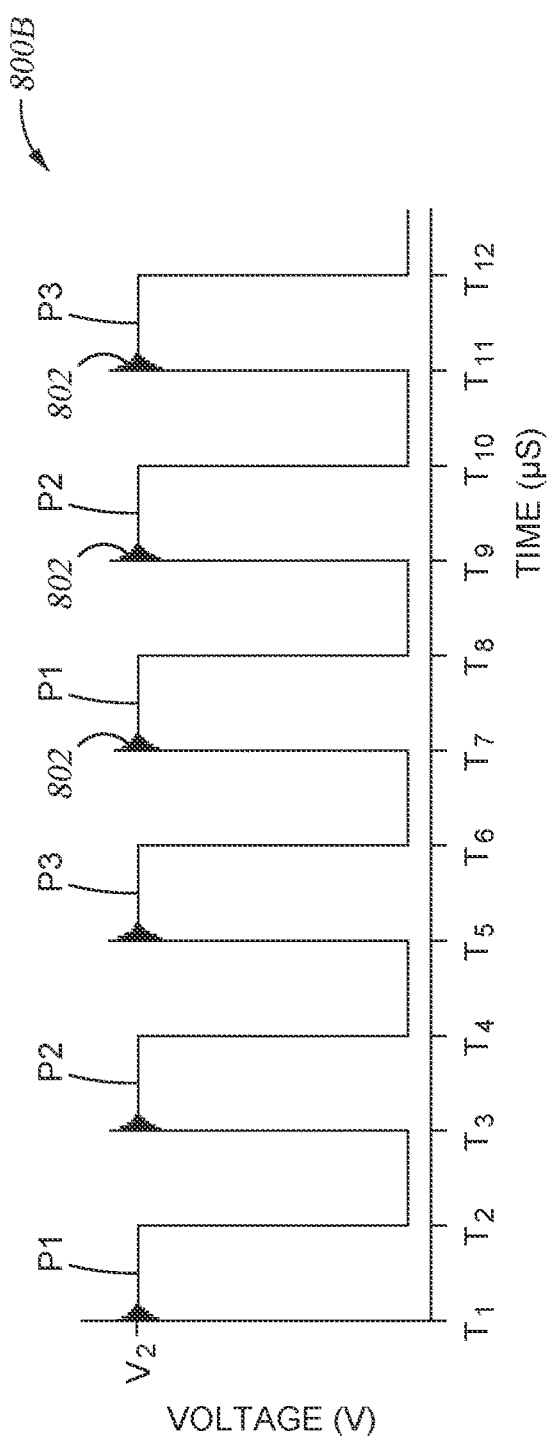
FIG. 8B is a graph showing an output provided by the pulser during the mode of operation illustrated in FIG. 8A, in accordance with certain embodiments of the present disclosure.

FIG. 8A is a graph showing states of switches (e.g., transistors 410, 412, 414) as a function of time that are used to generate a voltage pulse from the pulser 400 during another example of a mode of operation, in accordance with certain embodiments of the present disclosure. Graph 800A is a diagram showing the state of each of the transistors 410, 412, and 414 (e.g., Q1, Q2, Q3) when a gate signal is applied to each of their respective gate drive circuits 418, 420 422 at different times. In some embodiments, the system controller 126 may control the application of a gate signal to each of the gate drive circuits 418, 420 422 to activate each of the transistors 410, 412, and 414 of the modules 440, 442, and 444 at desired times within a pulsing sequence. In graph 800A, a gate signal (e.g., $V_1$) is applied first to module 440 to generate pulse trigger TR1 between times $T_1$ and $T_2$, then to module 442 to generate pulse trigger TR2 between times $T_3$ and $T_4$, and finally to module 444 between $T_5$ and $T_6$ to generate trigger TR3. Graph 800B, found in FIG. 8B, illustrates the voltage (e.g., $V_2$) seen at the common node 480 as a result of the generated voltage pulses P1, P2, P3 during their respective time intervals. Triggering multiple modules of a pulser 400 consecutively may allow for the frequency of the output voltage to be increased. The pulses may be repeated during intervals $T_7$-$T_8$, $T_9$-$T_{10}$ and $T_{11}$-$T_{12}$ as illustrated. In some embodiments, due to the sequential delivery of pulses from each module within the pulser the provided pulsing frequency (F1) provided by the pulser 400 can achieve an output pulse frequency that masks switching hardware frequency (F2) limitations found in each module, since the hardware in each module need only deliver a pulse at its spot within the sequence of pulses (e.g., every third pulse in the sequence in FIG. 8B) and thus prevent each module from exceeding it capability to reliably deliver pulses at frequencies (F1) that exceeds the hardware's functional limits (e.g., voltage limitations, switching frequency limitations, and other limitations of the transistors 410, 412, and 414). During a pulse, the voltage waveform may experience some amount of ringing (e.g., 802), as a result of the long wires and the associated stray inductance. The amount of ringing may be adjusted and/or minimized by the design of the pulser 400 and processing system 100 that is utilized.

FIG. 9A is a graph showing states of switches (e.g., transistors 410, 412, 414) of the pulser 400 during another example of a mode of operation, in accordance with certain embodiments of the present disclosure. Graph 900A is a diagram showing the state of each of the transistors 410, 412, and 414 (e.g., Q1, Q2, Q3) when gate signals are applied to each of the respective gate drive circuits 418, 420 422 at different times. In some embodiments, the system controller 126 may control application of a gate signal to the gate drive circuits 418, 420 422 to activate the transistors 410, 412, and 414 of the modules 440, 442, and 444. As shown in in FIG. 9A, the system controller 126 may send to the gate drive circuits 418, 420 422 gate signals that have different pulse widths. In graph 900A, a gate signal (e.g., $V_1$) is applied first to module 440 to generate trigger pulse TR1 between times $T_1$ and $T_2$. Another gate signal (e.g., $V_1$) is applied to module 442 to generate trigger pulse TR2 between times $T_3$ and $T_4$. A third gate signal (e.g., $V_1$) is applied to module 444 between times $T_5$ and $T_6$ to generate trigger pulse TR3. Graph 800B, as shown in FIG. 9B, illustrates the voltage (e.g., $V_2$) seen at the common node 480 as a result of the generated voltage pulses P1, P2, P3 during their respective intervals defined by the signals provided by the system controller 126. The width of each pulse P1, P2, and P3 provided to the common node 480 is different as a result of the varied pulse widths of the applied gate signals. In this manner, an output waveform can include generated pulses that each have a different pulse width that are provided at a desired time within a pulse sequence. Triggering multiple modules of a pulser 400 using different gate signals with different pulse widths may allow for the output signal shape and pulse width to be modified to suit a desired IEDF. The pulses may be repeated during intervals $T_7$-$T_8$, $T_9$-$T_{10}$, and $T_{11}$-$T_{12}$ as illustrated.

FIG. 10A is a graph showing states of switches (e.g., transistors 410, 412, 414) of the pulser 400 during another example of a mode of operation, in accordance with certain embodiments of the present disclosure. In FIGS. 10A and 10B, $V_1$ represents a gate signal, which may be a TTL signal (e.g., between 1.5V and 5V), and $V_2$, $V_3$, $V_4$ represent the output voltages (e.g., 1000V, 2000V, 3000V). Graph 1000A is a diagram illustrating the state of each of the transistors 410, 412, and 414 (e.g., Q1, Q2, Q3) when different gate signals are applied to each of the respective gate drive circuits 418, 420 422 at different times. In some embodiments, the system controller 126 may control the application of gate signals provided to the gate drive circuits 418, 420 422 to activate the transistors 410, 412, and 414 of the modules 440, 442, and 444. The system controller 126 may send to the gate drive circuits 418, 420 422 gate signals with different pulse widths. In graph 1000A, a gate signal (e.g., $V_1$) is applied first to module 440 to generate trigger pulse TR1 between times $T_1$ and $T_2$. Another gate signal (e.g., $V_1$) is applied to module 442 to generate trigger pulse TR2 between times $T_3$ and $T_4$. A third gate signal is applied to module 444 between times $T_5$ and $T_6$ to generate trigger pulse TR3. Graph 1000B, shown in FIG. 10B, illustrates the voltage generated at the common node 480 as a result of the pulses P1, P2, P3 generated by each module 440, 442, and 444 during their respective time interval. During the time interval between times $T_1$ and $T_2$, pulse P1 includes a voltage $V_3$ due to the delivery of the voltage ($V_{s1}$) stored in the capacitive element 402 (e.g., voltage source) to the primary windings 452, which generates at the secondary winding 454 the voltage $V_3$ due to the first transformer ratio of the transformer 450. During the time interval between times $T_3$ and $T_4$, pulse P2 includes a voltage $V_4$ due to the delivery of the voltage ($V_{s2}$) stored in the capacitive element 404 (e.g., voltage source) to the primary windings 462, which generates at the secondary winding 464 the voltage $V_4$ due to the second transformer ratio of the transformer 460. During the time interval between times $T_5$ and $T_6$, pulse P3 includes a voltage $V_2$ due to the delivery of the voltage ($V_{s3}$) stored in the capacitive element 406 (e.g., voltage source) to the primary windings 472, which generates at the secondary winding 474 the voltage $V_2$ due to the first transformer ratio of the first transformer 470. The width and magnitude of each pulse P1, P2, and P3 is different as a result of the varied pulse widths applied and the different transformer ratios and/or input voltages applied by the use of the transformers 450, 460, and 470, respectively. In this manner, output waveforms with different voltages and different pulse widths can be generated, which may enable a more preferred IEDF of the output waveform. In one example, the modules can include transformers that each have the same transformer ratio, while the voltage input sources are configured to provide different peak input voltages, so that different peak voltage levels can be generated in the output voltage waveform pulses P1, P2, and P3. In another example, the modules include transformers that each have different transformer ratio, while the voltage input sources are each configured to provide the same peak input voltage, so that different peak voltage levels can be generated in the output voltage waveform pulses P1, P2, and P3. Triggering multiple modules of a pulser 400 using input voltages and different gate signals with different pulse widths may allow for the output signal shape and pulse width to be modified to suit a desired IEDF. The pulses may be repeated during intervals $T_7$-$T_8$, $T_9$-$T_{10}$, and $T_{11}$-$T_{12}$ as illustrated.

FIG. 11A is a graph showing states of switches (e.g., transistors 410, 412, 414) of the pulser 400 during another example of a mode of operation, in accordance with certain embodiments of the present disclosure. In FIG. 11A-11D, $V_1$ and $V_5$ each represent a gate signal, which may be a TTL signal (e.g., between 1.5V and 5V), and $V_2$, $V_3$, $V_4$, $V_6$, $V_7$ represent the output voltages (e.g., 1000V, 2000V, 3000V). Graph 1100A is a diagram showing the state of each of the transistors 410, 412, and 414 (e.g., Q1, Q2, Q3) when a gate signal is applied to each of their respective gate drive circuits 418, 420 422 so that they overlap. In some embodiments, the system controller 126 delivers a gate signal to the gate drive circuits 418, 420 422 to activate the transistors 410, 412, and 414 of the modules 440, 442, and 444 to generate the pulse sequence shown in FIG. 11B. The system controller 126 may send to the gate drive circuits 418, 420 422 gate signals that include pulses that overlap in time. In graph 1100A, a gate signal (e.g., $V_1$) is applied first to module 440 to generate trigger pulse TR1 between times $T_1$ and $T_2$. Another gate signal is applied to module 442 to generate trigger pulse TR2 between times $T_1$ and $T_3$. A third gate signal is applied to module 444 between times $T_1$ and $T_4$ to generate trigger TR3. Here, the time interval between times $T_1$ and $T_2$ includes overlapping gate signals (e.g., $V_1$) provided to gate drive circuits 418, 420 422, continued overlapping gate signals (e.g., $V_1$) provided to gate drive circuits 420, 422 within the time interval between times $T_2$ and $T_3$, and a continuing gate signal (e.g., $V_1$) provided to gate drive circuit 422 during the time interval between $T_3$ and $T_4$. Graph 1100B, as shown in FIG. 11B, illustrates the voltage pulse created as a result of the generated voltage pulses P1, P2, P3 during their respective time intervals illustrated in FIG. 11A. During the time interval between times $T_1$ and $T_2$, a first portion of a pulse is generated that includes pulses P1, P2 and P3 generated by the modules 440, 442, 444 to create a portion of the pulse that has a voltage $V_2$. During the time interval between times $T_2$ and $T_3$, a second portion of the pulse is generated that includes pulses P2 and P3 generated by the modules 442, 444 to create a portion of the pulse that has a voltage $V_3$. During the time interval between times $T_3$ and $T_4$, a third portion of the pulse is generated that includes pulse P3 generated by the modules 444 to create a portion of the pulse that has a voltage $V_4$. The portions of a pulse may be repeated during time intervals $T_5$ and $T_6$, $T_6$ and $T_7$, and $T_7$ and $T_8$ as illustrated in FIG. 11B. In some embodiments, the pulses P1, P2, P3 provided to the gate drive circuits 418, 420 422 are generated by the system controller so that at least portion of two or more pulses overlap in time. As described herein, the transformer ratio of the transforms in the modules 440 442, 444 may be modified to customize the output voltage waveshape of the pulser 400 with different voltages and different pulse widths. Triggering multiple modules of a pulser 400 with varying transformer ratios may allow for the output signal shape and pulse width so that they overlap may allow for the generation of a waveform that may enable a desired IEDF distribution during plasma processing.

FIG. 11C is a graph showing states of switches (e.g., transistors 410, 412, 414) of the pulser 400 during another example of a mode of operation, in accordance with certain embodiments of the present disclosure. Varying the gate signal that is provided to the gate drive circuits 418, 420 422 by the system controller 126 is used to activate the transistors 410, 412, and 414 of the modules 440, 442, and 444 to enable a voltage waveform that steps up, or step down, in voltage to allow the generation of a waveform that enables a desired IEDF distribution. The timing of the gate signals applied to the gate drive circuits 418, 420 422 may be manipulated to control the overlap of the voltage pulses P1, P2, P3 provided by each module 440, 442, and 444 to generate different types of waveforms to form a more preferred IEDF during plasma processing. Graph 1100D (FIG. 11D) illustrates an example of a voltage waveform that steps down at time $T_{10}$, and steps up at time $T_{11}$, as a result of the applied trigger pulses $TR_4$, $TR_5$, $TR_6$. Graph 1100D is a diagram showing the state of each of the transistors 410, 412, and 414 (e.g., Q1, Q2, Q3) when a different gate signal is applied to each of their respective gate drive circuits 418, 420 422 so that they overlap. In some embodiments, the system controller 126 may control application of a gate signal to the gate drive circuits 418, 420 422 to activate the transistors 410, 412, and 414 of the modules 440, 442, and 444. The gate drive circuits 418, 420 422 may apply gate signals so that the pulses overlap. In graph 1100C, a gate signal (e.g., $V_5$) is applied first to module 440 to generate trigger pulse TR4 between times $T_9$ and $T_{10}$, then to module 442 to generate trigger pulse TR5 between times $T_{10}$ and $T_{11}$, and finally to module 444 between times $T_{11}$ and $T_{12}$ to generate trigger pulse TR6. Here, the interval between times $T_9$ and $T_{10}$ overlaps with the interval between times $T_{10}$ and $T_{11}$, and the interval between times $T_{10}$ and $T_{11}$ overlaps with the interval between times $T_{11}$ and $T_{12}$. Graph 1100D illustrates the voltage seen at the common node 480 as a result of the generated pulses P1, P2, P3 during their respective intervals. During the interval between times $T_9$ and $T_{10}$, pulse P1 generates a voltage $V_6$. During the interval between times $T_{10}$ and $T_{11}$, pulse P2 generates a voltage $V_7$. During the interval between times $T_{11}$ and $T_{12}$, pulse P3 generates a voltage $V_6$. The pulses may be repeated during intervals $T_{13}$-$T_{14}$, $T_{14}$-$T_{15}$ and $T_{15}$-$T_{16}$ as illustrated. In this example, pulses P4 and P6 both include a higher voltage (e.g., $V_6$) than the voltage included in pulse P5 (e.g., $V_7$,), as illustrated. Triggering multiple modules of a pulser 400 where modules can generate different voltages may allow for the generation of various waveform that may enable a desired IEDF distribution.

FIG. 12 illustrates a charging circuit 1200 used to charge a capacitive element 1212, in accordance with certain aspects of the present disclosure. The capacitive element 1212 may correspond to any one of capacitive elements 402, 404, and 406. In other words, a charging circuit (e.g., similar to charging circuit 1200) may be implemented for each of capacitive elements 402, 404, and 406 to charge the capacitive elements to their respective voltages, as described herein. The charging circuit 1200 may include an inverter 1202 for converting a DC voltage to an alternating current (AC) voltage. The AC voltage may be provided to a primary winding 1206 of a transformer 1204. The transformer may generate an AC voltage at the secondary winding 1208 having a higher voltage than the AC voltage at the primary winding 1206. For example, to charge capacitive element 1202, the AC voltage at the secondary winding 1208 may have a peak voltage of 1200 volts. The AC voltage at the secondary winding 1208 may be provided to a rectifier 1210 to generate a DC signal used to charge the capacitive element 1212.

Voltage Waveform Generation Examples

Figure 13:
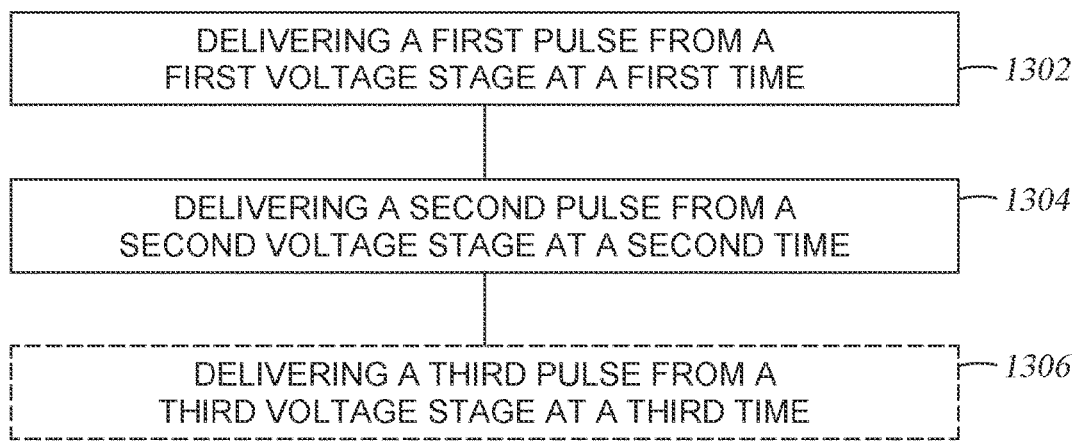
FIG. 13 is a process flow diagram illustrating a method of waveform generation, in accordance with certain embodiments of the present disclosure.

FIG. 13 is a process flow diagram illustrating a method 1300 of waveform generation, in accordance with certain embodiments of the present disclosure. The method 1300 may be performed by a waveform generation system, including a waveform generator such as the pulser 400 and/or control circuitry such as the system controller 126. The methods 1300 discussion below is described in conjunction with the schematic of the pulser 400 that is illustrated in FIG. 4. As discussed above, in some embodiments, the common node 480 illustrated in FIG. 4 is configured to be coupled to an electrode within the plasma processing system 100.

At activity 1302, the waveform generator (e.g., pulser 400) delivers a first pulse from a first voltage stage 444 at a first time. Delivering a first pulse from the first voltage stage will include generating a first voltage pulse at a common node 480 by closing a first switch (e.g., transistor 414) that is coupled to the first voltage source 406 and the first transformer 470. The first voltage source 406 is configured to provide a first voltage $V_{P1}$ to the primary winding 472 of the first transformer 470. The first transformer has a first transformer ratio, and thus a second voltage $V_{T2}$ is formed in the secondary winding 474 of the first transformer, where the second voltage $V_{T2}$ is equal to the first voltage $V_{P1}$ times the transformer ratio. The common node 480, which is coupled to a first terminal of a secondary winding 474, will then see the formed first pulse that includes the provided second voltage $V_{T2}$.

At activity 1304, the waveform generator (e.g., pulser 400) delivers a second pulse from a second voltage stage 442 at a second time. Delivering a second pulse from a second voltage stage 442 will include generating a second voltage pulse at the common node 480 by closing a second switch (e.g., transistor 412) that is coupled to the second voltage source 404 and the second transformer 460. The second voltage source 404 is configured to provide a third voltage $V_{P3}$ to the primary winding 462 of the second transformer 460. The second transformer has a second transformer ratio, and thus a fourth voltage $V_{T4}$ is formed in the secondary winding 464 of the second transformer, where the fourth voltage $V_{T4}$ is equal to the third voltage $V_{P3}$ times the second transformer ratio. The common node 480, which is coupled to a first terminal of a secondary winding 464, will then see the formed second pulse that includes the provided fourth voltage $V_{T4}$. When a second module 442 delivers the second pulse, the second pulse may be combined with the generated first pulse provided in activity 1302 as desired, such as one or more of the pulsing configurations discussed above in relation to FIGS. 5A-11D.

At activity 1306, the waveform generator (e.g., pulser 400) delivers a third pulse from a third voltage stage 440 at a third time. Delivering a third pulse from a third voltage stage 440 will include generating a third voltage pulse at the common node 480 by closing a third switch (e.g., transistor 410) that is coupled to the third voltage source 402 and the third transformer 450. The third voltage source 402 is configured to provide a fifth voltage $V_{P5}$ to the primary winding 452 of the third transformer 450. The third transformer has a third transformer ratio, and thus a sixth voltage $V_{T6}$ is formed in the secondary winding 464 of the second transformer, where the fourth voltage $V_{T6}$ is equal to the fifth voltage $V_{P5}$ times the third transformer ratio. The common node 480, which is coupled to a first terminal of a secondary winding 454, will then see the formed third pulse that includes the provided sixth voltage $V_{T6}$. When a third module 442 delivers the third pulse, the third pulse may be combined with the generated first and/or second pulses provided in activities 1302 and 1304 as desired, such as one or more of the pulsing configurations discussed above in relation to FIGS. 5A-11D.

In some embodiments of method 1300, activities 1302, 1304, 1306 may each be separated by a time interval. In other embodiments of method 1300, the delivery of the pulses provided during activities 1302, 1304, 1306 may be at least partially overlapping, as is described above. As described herein, the method 1300 referred to in FIGS. 5A-5B and 7A-11D may involve triggering multiple modules of a pulser 400 with varying transformer ratios during plasma processing to customize the output voltage waveshape of the pulser 400 with different voltages and different pulse widths, in order to enable the generation of a waveform that may enable a desired IEDF distribution during plasma processing.

In some embodiments, the third transformer ratio may be the same as the first transformer ratio or the second transformer ratio. In other embodiments, the third transformer ratio may be different from the first transformer ratio and the second transformer ratio. As noted above, in some embodiments, the first transformer ratio, the second transformer ratio and the third transformer ratio are all the same or are all different from each other. In one example, the transformer ratios may be within a range between 1:1 and 1:4, such as between 1:1.5 and 1:4. In an alternate example, the transformer ratios may be within a range between 4:1 and 1:1, such as between 2:1 and 1.5:1.

In some embodiments, the first voltage $V_{P1}$, third voltage $V_{P3}$, and fifth voltage $V_{P5}$, which are provided by the first voltage source 406, second voltage source 404 and third voltage source 402, respectively, are all set at the same voltage level (e.g. +100 to +800 volts). In some embodiments, one or more of the first voltage $V_{P1}$, third voltage $V_{P3}$, and fifth voltage $V_{P5}$ are set to different voltage levels. In one example, the first voltage $V_{P1}$, third voltage $V_{P3}$, and fifth voltage $V_{P5}$ are set to a voltage level ranging from +100 to +800 volts. In another example, the first voltage $V_{P1}$, third voltage $V_{P3}$, and fifth voltage $V_{P5}$ are set to a voltage level from 100 to 10,000 volts, such as 100 to 1,000 volts. In some embodiments, the polarity of the output voltage seen at the common node 480 may be negative, and may be changed, so that the voltage polarity is positive.

The processing chamber 100 includes a system controller 126 includes a central processing unit (CPU) 133, a memory 134, and support circuits 135, as described above. In some embodiments, memory 134 may be a computer readable medium memory configured to store instructions (e.g., computer-executable code) that when executed by the CPU 133, cause the processing chamber 100 to perform the operations illustrated in FIG. 13 and described above, or other operations for performing the various techniques discussed herein for providing a voltage waveform.

In some embodiments, the CPU 133 has circuitry configured to implement the code stored in the computer-readable medium/memory 134. For example, the circuitry includes circuitry for delivering a first pulse from a first voltage stage (e.g., 444) at a first time and delivering a second pulse from a second voltage stage (e.g., 442) at a second time. In some embodiments, the circuitry includes circuitry for delivering a third pulse from a third voltage stage (e.g., 440) at a third time.

Additional Considerations

The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:
1. A waveform generator comprising:
 a first voltage stage comprising:
  a first voltage source;
  a first ground reference coupled to the first voltage source; and
  a first transformer having a first transformer ratio, the first transformer comprising:
   a primary winding coupled to the first voltage source and the first ground reference; and
   a secondary winding including a first end and a second end, wherein the first end is electrically coupled to the first ground reference; and a second voltage stage comprising:
  a second voltage source;
  a second ground reference coupled to the second voltage source; and
  a second transformer having a second transformer ratio, the second transformer comprising:
    a primary winding coupled to the second voltage source and the second ground reference; and
    a secondary winding including a first end and a second end, wherein the first end of the secondary winding of the second transformer is coupled to the second end of the secondary winding of the first transformer and wherein the primary winding of the first transformer is not coupled to the primary winding of the second transformer.

2. The waveform generator of claim 1, wherein the secondary winding of the first transformer is coupled in series with the secondary winding of the second transformer.

3. The waveform generator of claim 1, wherein the first voltage source and the second voltage source are each configured to provide different voltages.

4. The waveform generator of claim 1, wherein a voltage at the first voltage source and a voltage at the second voltage source are individually adjustable.

5. The waveform generator of claim 1, wherein the first transformer ratio is different than the second transformer ratio.

6. The waveform generator of claim 5, wherein the first transformer ratio is smaller than the second transformer ratio.

7. The waveform generator of claim 5, wherein the first transformer ratio is greater than the second transformer ratio.

8. The waveform generator of claim 1, wherein the first voltage source comprises a first capacitive element and the second voltage source comprises a second capacitive element.

9. The waveform generator of claim 1, further comprising a common node for capacitively coupling to a plasma formed in a processing region of a plasma processing system, wherein the common node is coupled to the second end of the secondary winding of the second transformer.

10. The waveform generator of claim 9, wherein the common node is coupled to a biasing electrode disposed within a substrate support disposed within the plasma processing system.

11. The waveform generator of claim 1, further comprising a third voltage stage comprising:
  a third voltage source;
  a third ground reference coupled to the third voltage source; and
  a third transformer having a third transformer ratio, the third transformer comprising:
    a primary winding coupled to the third voltage source and the third ground reference; and
    a secondary winding including a first end and second end, the first end of the secondary winding coupled to the second end of the secondary winding of the second transformer.

12. A method of generating a voltage waveform, the method comprising:
  generating, using a first voltage source included in a first voltage stage, a first voltage pulse at a common node at a first time, wherein:
    the first voltage source is coupled to a first ground reference node;
    a primary winding of a first transformer is coupled to the first voltage source;
    a secondary winding of the first transformer is coupled to the common node;
    the second winding is electrically coupled to the first ground reference node; and
    the first transformer has a first transformer ratio; and
  generating, using a second voltage source included in a second voltage stage, a second voltage pulse at the common node at a second time, wherein:
    the second voltage source is coupled to a second ground reference node;
    a primary winding of a second transformer is coupled to the second voltage source;
    a secondary winding of the second transformer is coupled to the secondary winding of the first transformer;
    the second transformer has a second transformer ratio;
    a first bias voltage is generated by the second voltage source; and
    the primary winding of the first transformer is not coupled to the primary winding of the second transformer.

13. The method of claim 12, wherein the secondary winding of the first transformer is coupled in series with the secondary winding of the second transformer.

14. The method of claim 12, wherein the first voltage pulse is different than the second voltage pulse.

15. The method of claim 12, wherein the first voltage pulse and the second voltage pulse overlap in time.

16. The method of claim 12, wherein the first transformer ratio is different than the second transformer ratio.

17. The method of claim 16, wherein the first transformer ratio is smaller than the second transformer ratio.

18. The method of claim 16, wherein the first transformer ratio is greater than the second transformer ratio.

19. The method of claim 12, wherein the common node is coupled to a biasing electrode disposed within a substrate support disposed within a plasma processing system.

20. The method of claim 12, further comprising:
  generating, using a third voltage source included in a third voltage stage, a third voltage pulse at the common node at a third time, wherein:
    the third voltage source is coupled to a third ground reference node;
    a primary winding of a third transformer is coupled to the third voltage source;
    a secondary winding of the third transformer is coupled to the secondary winding of the second transformer;
    the third transformer has a third transformer ratio;
    a second bias voltage is generated by the third voltage source; and
    the primary winding of the second transformer is not coupled to the primary winding of the third transformer.

* * * * *